(12) United States Patent
Kondo et al.

(10) Patent No.: US 12,107,396 B2
(45) Date of Patent: Oct. 1, 2024

(54) LIGHT-EMITTING DEVICE, OPTICAL DEVICE, AND INFORMATION PROCESSING DEVICE

(71) Applicant: FUJIFILM Business Innovation Corp., Tokyo (JP)

(72) Inventors: Takashi Kondo, Ebina (JP); Kenichi Ono, Ebina (JP); Daisuke Iguchi, Ebina (JP); Yoshinori Shirakawa, Ebina (JP); Tomoaki Sakita, Ebina (JP); Tsutomu Otsuka, Yokohama (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 467 days.

(21) Appl. No.: 17/478,551

(22) Filed: Sep. 17, 2021

(65) Prior Publication Data

US 2022/0006268 A1    Jan. 6, 2022

Related U.S. Application Data

(63) Continuation of application No. PCT/JP2019/048136, filed on Dec. 9, 2019.

(30) Foreign Application Priority Data

Apr. 10, 2019    (JP) .................... 2019-074541

(51) Int. Cl.
*H01S 5/42*    (2006.01)
*G01B 11/24*   (2006.01)
(Continued)

(52) U.S. Cl.
CPC .............. *H01S 5/423* (2013.01); *G01B 11/24* (2013.01); *G06V 10/88* (2022.01); *G06V 20/64* (2022.01); *G06V 40/169* (2022.01)

(58) Field of Classification Search
CPC .... H01S 5/423; H01S 5/2009; H01S 5/34313; H01S 2301/16; H01S 2301/163;
(Continued)

(56) References Cited

U.S. PATENT DOCUMENTS

2013/0050779 A1    2/2013  Stowe et al.
2013/0083304 A1*   4/2013  Kondo ................ H01S 5/18358
                                                        355/55
(Continued)

FOREIGN PATENT DOCUMENTS

CN    107884066 A  *  4/2018  ........... G01B 11/026
CN    109211135 A  *  1/2019  .............. F21K 9/20
(Continued)

OTHER PUBLICATIONS

Mar. 3, 2020 Search Report issued in International Patent Application No. PCT/JP2019/048136.
(Continued)

*Primary Examiner* — Michelle M Iacoletti
*Assistant Examiner* — Judy Dao Tran
(74) *Attorney, Agent, or Firm* — Oliff PLC

(57) ABSTRACT

A light-emitting device includes: a first light-emitting element array that includes plural first light-emitting elements arranged at a first interval; a second light-emitting element array that includes plural second light-emitting elements arranged at a second interval wider than the first interval, second light-emitting element array being configured to output a light output larger than a light output of the first light-emitting element array, and being configured to be driven independently from the first light-emitting element array; and a light diffusion member provided on an emission path of the second light-emitting element array.

19 Claims, 13 Drawing Sheets

(51) Int. Cl.
*G06V 10/88* (2022.01)
*G06V 20/64* (2022.01)
*G06V 40/16* (2022.01)

(58) Field of Classification Search
CPC ............ H01S 5/18313; H01S 5/18358; H01S 5/04256; H01S 5/02257; H01S 5/0428; G01B 11/24; G06V 10/88; G06V 20/64; G06V 40/169; G01S 7/4815; G01S 7/4863; G01S 17/86; G01S 17/894; H01L 31/12
See application file for complete search history.

(56) References Cited

U.S. PATENT DOCUMENTS

| | | |
|---|---|---|
| 2014/0044438 A1 | 2/2014 | Takeda et al. |
| 2015/0273863 A1 | 10/2015 | Stowe et al. |
| 2015/0340841 A1 | 11/2015 | Joseph |
| 2019/0335073 A1 | 10/2019 | Yamashita et al. |
| 2021/0376574 A1* | 12/2021 | Wang ..................... H01S 5/423 |

FOREIGN PATENT DOCUMENTS

| | | | |
|---|---|---|---|
| JP | 2013-093571 A | 5/2013 | |
| JP | 2014-036027 A | 2/2014 | |
| JP | 2016200808 A | * 12/2016 | ............... B41J 2/44 |
| JP | 2017-098532 A | 6/2017 | |
| JP | 2018-054769 A | 4/2018 | |

OTHER PUBLICATIONS

Mar. 3, 2020 Written Opinion issued in International Patent Application No. PCT/JP2019/048136.
Dec. 16, 2022 Extended European Search Report Issued in European Patent Application No. 19924524.2.
Dec. 13, 2022 Office Action Issued in Japanese Patent Application No. 2019-074541.
Mar. 7, 2023 Office Action Issued in Japanese Patent Application No. 2019-074541.
Mar. 12, 2024 Hearing Notice issued in Indian Patent Application No. 202147042422.

\* cited by examiner

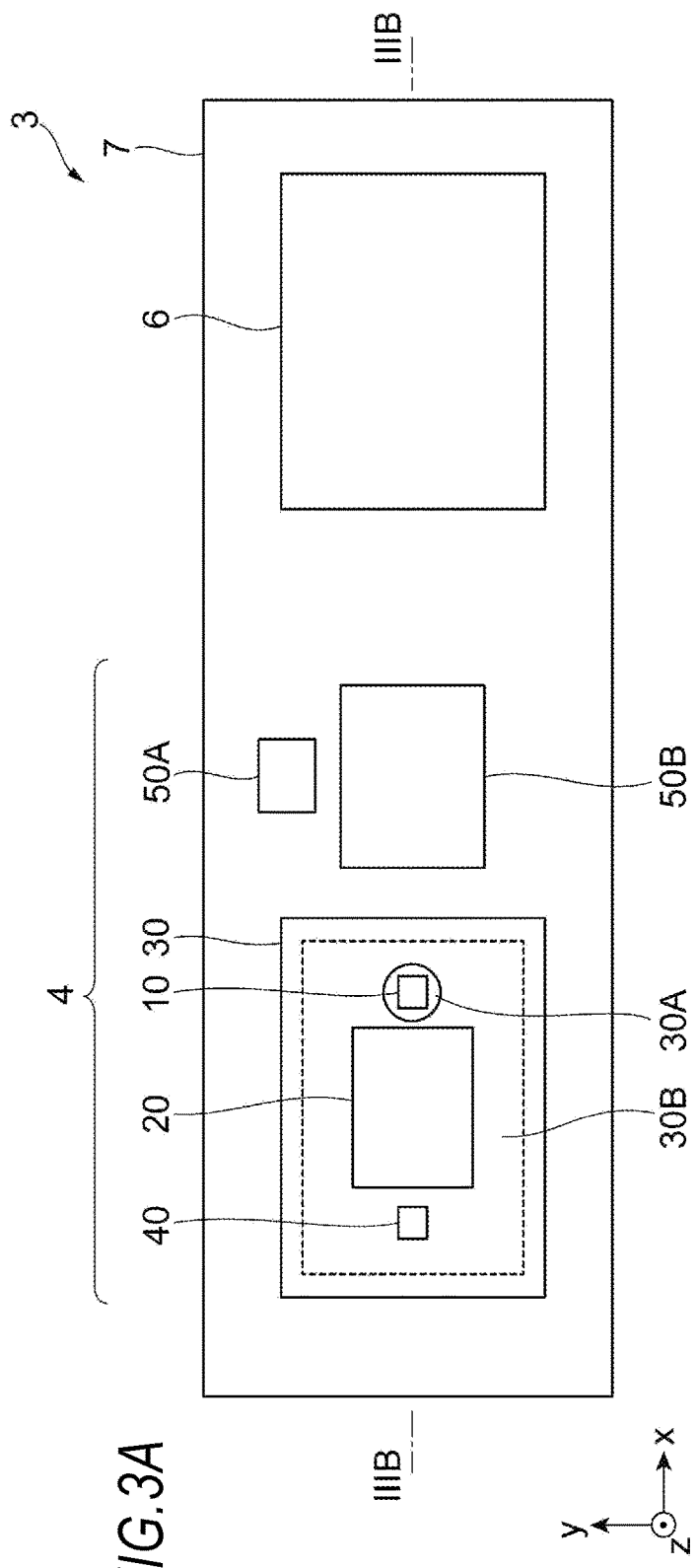
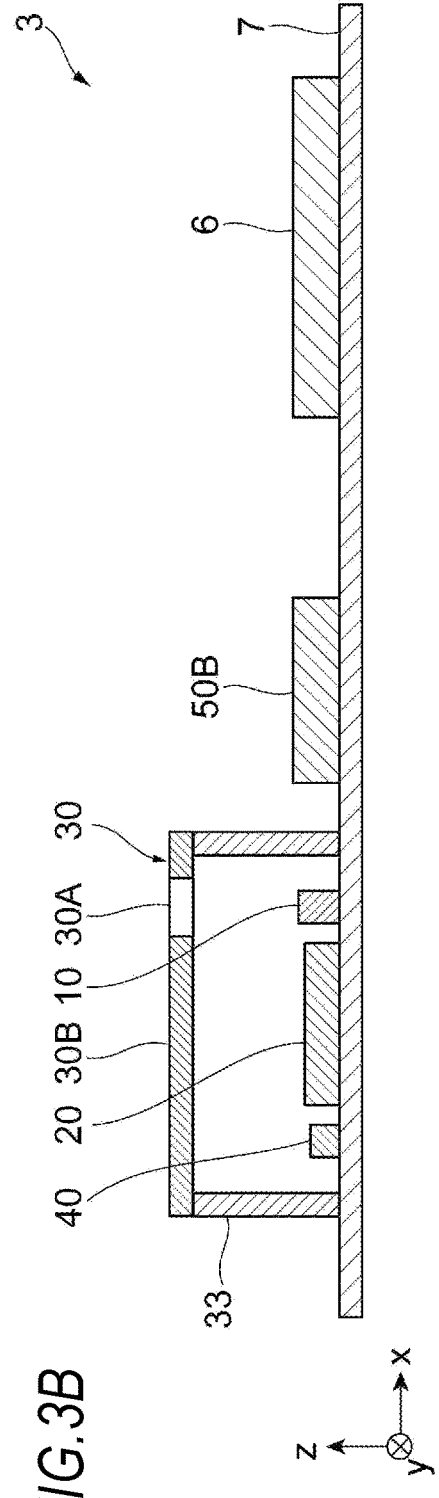

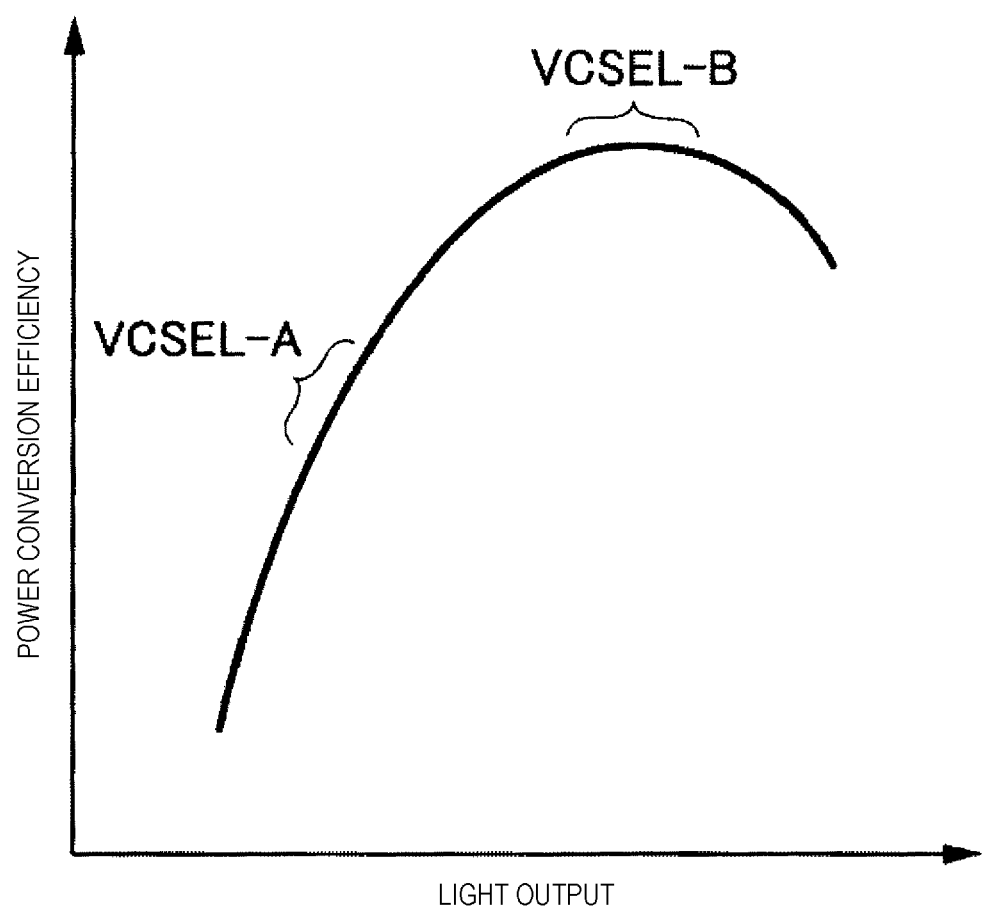

LIGHT-EMITTING DEVICE, OPTICAL DEVICE, AND INFORMATION PROCESSING DEVICE

CROSS REFERENCE TO RELATED APPLICATION

This is a continuation of International Application No. PCT/JP2019/048136 filed on Dec. 9, 2019, and claims priority from Japanese Patent Application No. 2019-74541 filed on Apr. 10, 2019.

BACKGROUND

Technical Field

The present invention relates to a light-emitting device, an optical device, and an information processing device.

Related Art

JP-A-2018-54769 discloses an imaging device including: a light source; a diffusion plate that has plural lenses arranged adjacent to one another on a predetermined plane and diffuses light emitted from the light source; and an imaging element that receives reflected light obtained by a subject reflecting the light diffused by the diffusion plate. The plural lenses are arranged such that a cycle of interference fringes in the diffused light is three pixels or less.

SUMMARY

A configuration is known in which an object to be measured is irradiated with light that is emitted from a light-emitting element and is diffused via a light diffusion member so as to measure a three-dimensional shape of the object to be measured.

In such a configuration, from the viewpoint of energy saving or the like, a configuration is conceivable in which a proximity detection light-emitting element array that detects whether the object to be measured is within a predetermined distance is used, and when the object to be measured is within the predetermined distance, light having a large light output for three-dimensional measurement is diffused and radiated from another light-emitting element array.

It is desired that the proximity detection light-emitting element array have a narrow irradiation area on an irradiation surface so that a desired light density can be obtained on the irradiation surface of the object to be measured even with a small light output. On the other hand, a three-dimensional measurement light-emitting element array is required to have a large light output that can radiate light onto a wide irradiation area, and it is desired to prevent a temperature rise of a light-emitting element.

Aspects of non-limiting embodiments of the present disclosure relate to a light-emitting device or the like that includes a first light-emitting element array and a second light-emitting element array configured to output a light output larger than a light output of the first light-emitting element array, and that can easily achieve both reduction in an irradiation area by the first light-emitting element array and prevention of a temperature rise in the second light-emitting element array, as compared with a case where an interval between light-emitting elements in the first light-emitting element array is equal to an interval between light-emitting elements in the second light-emitting element array.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including: a first light-emitting element array that includes plural first light-emitting elements arranged at a first interval; a second light-emitting element array that includes plural second light-emitting elements arranged at a second interval wider than the first interval, second light-emitting element array being configured to output a light output larger than a light output of the first light-emitting element array, and being configured to be driven independently from the first light-emitting element array; and a light diffusion member provided on an emission path of the second light-emitting element array.

BRIEF DESCRIPTION OF DRAWINGS

Exemplary embodiment(s) of the present invention will be described in detail based on the following figures, wherein:

FIG. 3A is a plan view showing an optical device;

FIG. 3B is a cross-sectional view taken along a line IIIB-IIIB in FIG. 3A;

FIG. 7 is a diagram showing a relationship between a light output and a power conversion efficiency of a general VCSEL;

DETAILED DESCRIPTION

Hereinafter, exemplary embodiments of the present invention will be described in detail with reference to the accompanying drawings.

In many cases, an information processing device identifies whether a user who accesses the information processing device is permitted to access the information processing device, and permits the use of the information processing device which is an own device only when it is authenticated that the user is permitted to access the information processing device. So far, a method of authenticating the user by a password, a fingerprint, an iris, or the like has been used. Recently, there is a demand for an authentication method having higher security. As this method, authentication based on a three-dimensional image such as a shape of a face of the user is performed.

Here, an example in which the information processing device is a portable information processing terminal will be described, and the information processing device authenticates a user by recognizing a shape of a face that is captured as a three-dimensional image. The information processing device may be applied to an information processing device such as a personal computer (PC) other than a portable information processing terminal.

Further, a configuration, a function, a method, and the like described in the present exemplary embodiment may also be applied to recognize a three-dimensional shape of an object other than a shape of a face. That is, the present invention may be applied to recognize a shape of an object to be measured other than a face. Further, a distance to an object to be measured is not limited.

[Information Processing Device 1]

Figure 1:
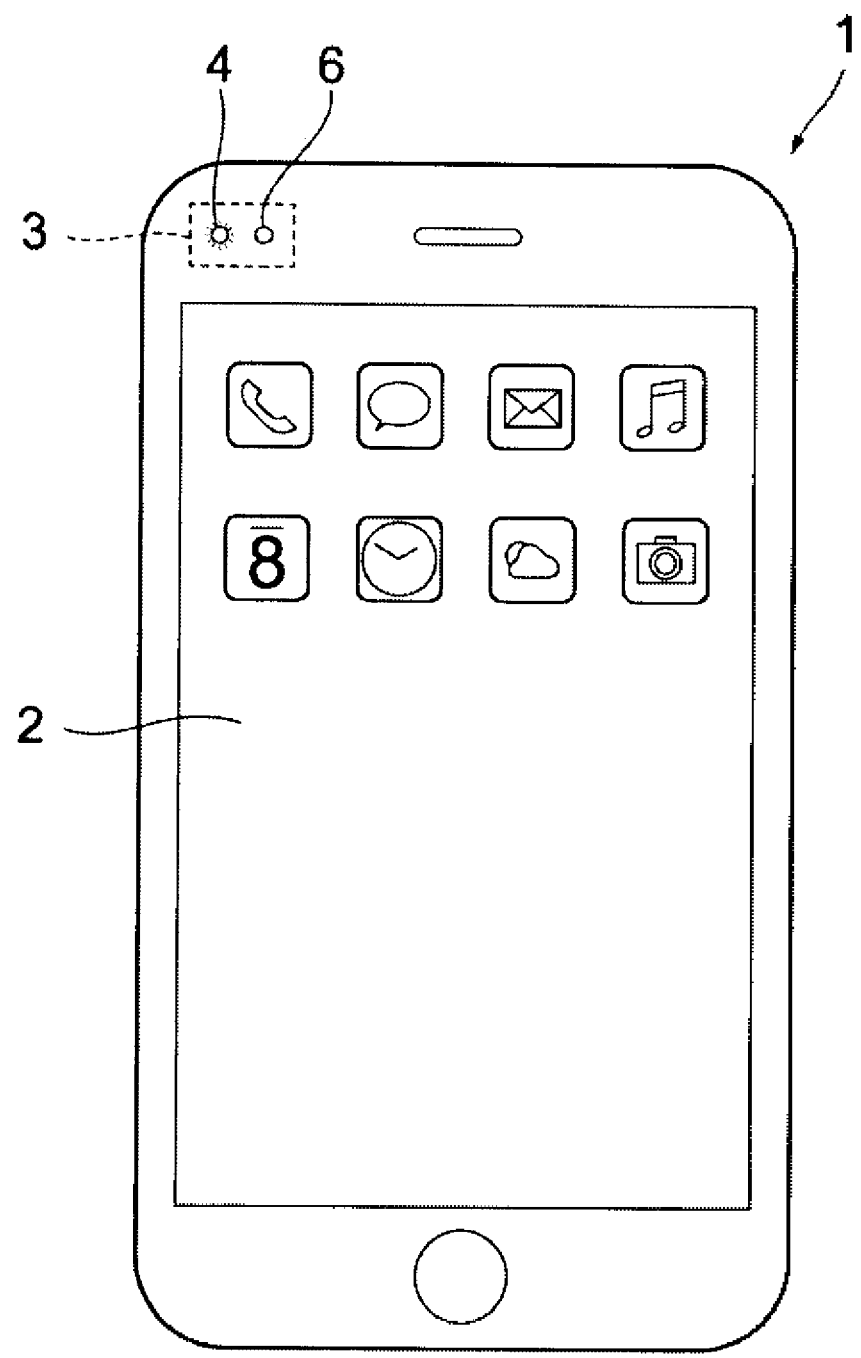
FIG. 1 is a diagram showing an example of an information processing device to which an exemplary embodiment is applied.

FIG. 1 is a diagram showing an example of an information processing device 1 to which the present exemplary embodiment is applied. As described above, the information processing device 1 is, for example, a portable information processing terminal.

The information processing device 1 includes a user interface unit (hereinafter, referred to as a UI unit) 2, and an optical device 3 that acquires a three-dimensional image. The UI unit 2 is configured by integrating, for example, a display device that displays information to a user and an input device to which an instruction for an information processing is input by an operation of the user. The display device is, for example, a liquid crystal display or an organic EL display. The input device is, for example, a touch panel.

The optical device 3 includes a light-emitting device 4 and a three-dimensional sensor (hereinafter, referred to as a 3D sensor) 6. The light-emitting device 4 emits light toward an object to be measured, that is, a face in the example described here, in order to acquire a three-dimensional image. The 3D sensor 6 acquires the light that is emitted by the light-emitting device 4, that is reflected by the face, and that is returned. Here, the three-dimensional image of the face is acquired based on a so-called time of flight (TOF) method based on flight time of light. Hereinafter, even in a case where a face is set as an object to be measured, the face is referred to as an object to be measured.

The information processing device 1 is configured as a computer including a CPU, a ROM, a RAM, and the like. The ROM includes a non-volatile rewritable memory such as a flash memory. Programs and constants stored in the ROM are loaded to the RAM and are executed by the CPU, so that the information processing device 1 is operated and various information processings are executed.

Figure 2:
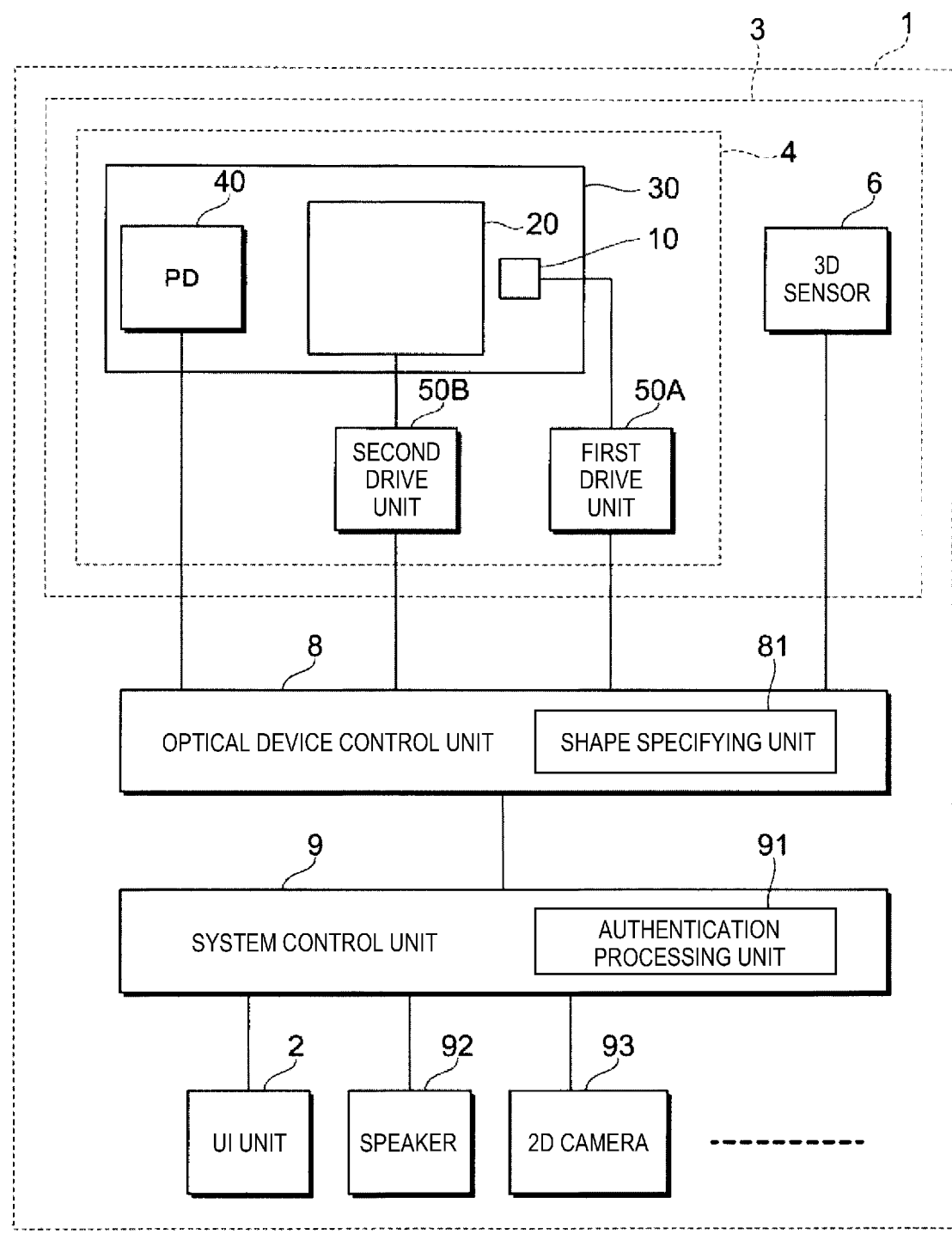
FIG. 2 is a block diagram showing a configuration of the information processing device.

FIG. 2 is a block diagram showing a configuration of the information processing device 1.

The information processing device 1 includes the optical device 3 described above, an optical device control unit 8, and a system control unit 9. As described above, the optical device 3 includes the light-emitting device 4 and the 3D sensor 6. The optical device control unit 8 controls the optical device 3. The optical device control unit 8 includes a shape specifying unit 81. The system control unit 9 controls the entire information processing device 1 as a system. The system control unit 9 includes an authentication processing unit 91. The UI unit 2, a speaker 92, a two-dimensional (2D) camera 93, and the like are connected to the system control unit 9. The 3D sensor 6 is an example of a light-receiving unit.

Hereinafter, the above components will be described in order.

As described above, the optical device 3 includes the light-emitting device 4 and the 3D sensor 6. The light-emitting device 4 includes a proximity detection light-emitting element array 10, a 3D shape measurement light-emitting element array 20, a diffusion plate 30, and a light amount monitoring light-receiving element (referred to as a PD in FIG. 2) 40, a first drive unit 50A, and a second drive unit 50B. The proximity detection light-emitting element array 10 is an example of a first light-emitting element array, the 3D shape measurement light-emitting element array 20 is an example of a second light-emitting element array, and the diffusion plate 30 is an example of a light diffusion member.

The first drive unit 50A in the light-emitting device 4 drives the proximity detection light-emitting element array 10, and the second drive unit 50B drives the 3D shape measurement light-emitting element array 20. For example, the proximity detection light-emitting element array 10 and the 3D shape measurement light-emitting element array 20 are driven to emit pulsed light of several tens of MHz to several hundreds of MHz (hereinafter, referred to as an emitted light pulse).

As will be described later, the optical device 3 is configured such that light radiated from each of the proximity detection light-emitting element array 10 and the 3D shape measurement light-emitting element array 20 toward the object to be measured is reflected from the object to be measured, and the reflected light is received by the 3D sensor 6.

The 3D sensor 6 includes plural light-receiving regions 61 (see FIG. 10 to be described later). The 3D sensor 6 outputs a signal corresponding to a time from when light is emitted from the proximity detection light-emitting element array 10 to when the light is reflected by the object to be measured and is received by the 3D sensor 6, and a signal corresponding to a time from when light is emitted from the 3D shape measurement light-emitting element array 20 to when the light is reflected by the object to be measured and is received by the 3D sensor 6. The 3D sensor 6 may include a condensing lens.

The light that is radiated from the proximity detection light-emitting element array 10 and is reflected from the object to be measured is an example of first reflected light, and the light that is radiated from the 3D shape measurement light-emitting element array 20 and is reflected from the object to be measured is an example of second reflected light.

The shape specifying unit 81 of the optical device control unit 8 acquires a digital value obtained for each of the light-receiving regions 61 from the 3D sensor 6, calculates a distance to the object to be measured for each light-receiving region 61, and specifies a 3D shape of the object to be measured.

The authentication processing unit 91 of the system control unit 9 executes an authentication processing related to the use of the information processing device 1 when the 3D shape of the object to be measured that is a specification result specified by the shape specifying unit 81 is a 3D shape stored in advance in the ROM or the like. The authentication processing related to the use of the information processing device 1 is, for example, a processing of determining whether to permit the use of the information processing device 1 that is an own device. For example, when the 3D shape of a face that is the object to be measured matches a face shape stored in a storage member such as a ROM, the use of the information processing device 1 that is the own device including various applications and the like provided by the information processing device 1 is permitted.

The shape specifying unit 81 and the authentication processing unit 91 are configured with, for example, a program. The shape specifying unit 81 and the authentication processing unit 91 may be configured with an integrated circuit such as an ASIC or an FPGA. Further, the shape specifying unit and the authentication processing unit may be configured with software such as a program and an integrated circuit.

Although the optical device 3, the optical device control unit 8, and the system control unit 9 are separately shown in FIG. 2, the system control unit 9 may include the optical device control unit 8. The optical device control unit 8 may be included in the optical device 3. Further, the optical device 3, the optical device control unit 8, and the system control unit 9 may be integrated with one another.

(Overall Configuration of Optical Device 3)

Next, the optical device 3 will be described in detail.

FIGS. 3A and 3B are a plan view and a cross-sectional view showing an example of the optical device 3. FIG. 3A is a plan view, and FIG. 3B is a cross-sectional view taken along a line IIIB-IIIB in FIG. 3A. Here, in FIG. 3A, a horizontal direction of a paper surface is defined as an x direction, and an upper direction of the paper surface is defined as a y direction. A direction orthogonal to the x direction and the y direction in a counterclockwise manner is defined as a z direction.

As shown in FIG. 3A, the light-emitting device 4 and the 3D sensor 6 are arranged in the x direction on a circuit board 7 in the optical device 3. The circuit board 7 uses a plate-shaped member made of an insulating material as a base member, and is provided with a conductor pattern made of a conductive material. For example, the insulating material is made of ceramic, an epoxy resin, and the like. A conductor pattern made of a conductive material is provided on the circuit board 7. The conductive material is, for example, a metal such as copper (Cu) and silver (Ag), or a conductive paste containing such a metal. The circuit board 7 may be a single-layer board having a conductor pattern provided on a front surface of the board, or may be a multilayer board having plural layers of conductor patterns. The light-emitting device 4 and the 3D sensor 6 may be disposed on different circuit boards.

For example, the light-emitting device 4 is implemented by sequentially arranging the light amount monitoring light-receiving element 40, the 3D shape measurement light-emitting element array 20, the proximity detection light-emitting element array 10, the first drive unit 50A, and the second drive unit 50B in the +x direction on the circuit board 7.

In a case where each of the proximity detection light-emitting element array 10 and the 3D shape measurement light-emitting element array 20 has a quadrangle shape in a plan view, that is, a planar shape of each of the proximity detection light-emitting element array 10 and the 3D shape measurement light-emitting element array 20 is a quadrangle shape, the proximity detection light-emitting element array 10 and the 3D shape measurement light-emitting element array 20 emit light in the same direction (the z direction in FIG. 3B). The planar shape of each of the proximity detection light-emitting element array 10 and the 3D shape measurement light-emitting element array 20 may not be a quadrangle shape. The proximity detection light-emitting element array 10 and the 3D shape measurement light-emitting element array 20 may be directly mounted on the circuit board 7, or may be mounted on the circuit board 7 via a heat dissipation base material such as aluminum oxide or aluminum nitride. Hereinafter, the proximity detection light-emitting element array 10 and the 3D shape measurement light-emitting element array 20 will be described as being mounted directly on the circuit board 7. Hereinafter, a plan view refers to a view from the z direction in FIG. 3A.

The first drive unit 50A that drives the proximity detection light-emitting element array 10 and the second drive unit 50B that drives the 3D shape measurement light-emitting element array 20 are arranged side by side in the y direction on the circuit board 7. A rated output of the first drive unit 50A is set to be smaller than a rated output of the second drive unit 50B. Therefore, the first drive unit 50A has a smaller external size than the second drive unit 50B. Since the second drive unit 50B is required to drive the 3D shape measurement light-emitting element array 20 with a large current, the second drive unit 50B is disposed with priority over the first drive unit 50A such that a distance between the second drive unit 50B and the 3D shape measurement light-emitting element array 20 is short. That is, the second drive unit 50B is arranged such that a wire for connecting the second drive unit 50B and the 3D shape measurement light-emitting element array 20 has a wide pattern width. On the other hand, the first drive unit 50A is disposed at a position laterally shifted from the second drive unit 50B, that is, the first drive unit 50A is disposed on the +y direction side of the second drive unit 50B.

The proximity detection light-emitting element array 10 is disposed between the 3D shape measurement light-emitting element array 20 and the second drive unit 50B on the circuit board 7. The light amount monitoring light-receiving element 40 is disposed on the circuit board 7 at a position close to the 3D shape measurement light-emitting element array 20, that is, at a side of the 3D shape measurement light-emitting element array 20 opposite to a position where the second drive unit 50B is disposed. In this manner, since the proximity detection light-emitting element array 10, the 3D shape measurement light-emitting element array 20, and the light amount monitoring light-receiving element 40 are arranged close to one another, these components may be easily covered with a common diffusion plate 30. On the other hand, in a case where the proximity detection light-emitting element array 10 and the 3D shape measurement light-emitting element array 20 are disposed apart from each other with a distance, when the proximity detection light-emitting element array 10 and the 3D shape measurement light-emitting element array 20 are covered with the common diffusion plate 30, the diffusion plate 30 needs to have a large size.

As shown in FIG. 3A, for example, the diffusion plate 30 has a rectangular planar shape. The diffusion plate 30 may not have a rectangular planar shape. As shown in FIG. 3B, the diffusion plate 30 is supported by a spacer 33 at a light emitting direction side of the proximity detection light-emitting element array 10 and the 3D shape measurement light-emitting element array 20, and is provided at a predetermined distance from the proximity detection light-emitting element array 10 and the 3D shape measurement light-emitting element array 20. The diffusion plate 30 is provided in a manner of covering the proximity detection light-emitting element array 10, the 3D shape measurement light-emitting element array 20, and the light amount monitoring light-receiving element 40. The spacer 33 is provided in a manner of surrounding the proximity detection light-emitting element array 10, the 3D shape measurement light-emitting element array 20, and the light amount monitoring light-receiving element 40. When the spacer 33 is formed of a member that absorbs the light emitted from the proximity detection light-emitting element array 10 and the 3D shape measurement light-emitting element array 20, the light emitted from the proximity detection light-emitting element array 10 and the 3D shape measurement light-emitting element array 20 is prevented from being emitted to the outside through the spacer 33. Since the proximity detection light-emitting element array 10, the 3D shape measurement light-emitting element array 20, and the like are sealed by the diffusion plate 30 and the spacer 33, dust-proof, moisture-proof, and the like may be achieved. In the present exemplary embodiment, the proximity detection light-emitting element array 10, the 3D shape measurement light-emitting element array 20, and the light amount monitoring light-receiving element 40 are arranged close to one another, so that the proximity detection light-emitting element array 10, the 3D shape measurement light-emitting element array 20, and the light amount monitoring light-receiving element 40 is easily surrounded by the spacer 33 having a small size. On the other hand, in a case where the proximity detection light-emitting element array 10 and the 3D shape measurement light-emitting element array 20 are disposed apart from each other with a distance, when the proximity detection light-emitting element array 10 and the 3D shape measurement light-emitting element array 20 are surrounded by the common spacer 33, the spacer 33 needs to have a large size. Although a configuration may be considered in which two small spacers 33 are prepared and the proximity detection light-emitting element array 10 and the 3D shape measurement light-emitting element array 20 are separately surrounded by the spacers 33, the number of components is doubled. The spacer 33 is not provided between the proximity detection light-emitting element array 10 and the 3D shape measurement light-emitting element array 20. Therefore, the light-emitting device 4 according to the present exemplary embodiment is reduced in size as compared with a configuration in which the spacer 33 is provided between the proximity detection light-emitting element array 10 and the 3D shape measurement light-emitting element array 20.

The light amount monitoring light-receiving element 40 is, for example, a photodiode (PD) that is made of silicon or the like and outputs an electric signal corresponding to an amount of received light.

The light amount monitoring light-receiving element 40 receives light that is emitted from the 3D shape measurement light-emitting element array 20 and is reflected by a back surface of the diffusion plate 30, that is, a surface at the −z direction side. The light amount monitoring light-receiving element 40 may receive light that is emitted from the proximity detection light-emitting element array 10 and is reflected by the back surface of the diffusion plate 30.

The 3D shape measurement light-emitting element array 20 is controlled by the second drive unit 50B via the optical device control unit 8 so as to maintain a predetermined light output corresponding to an amount of light received (received light amount) by the light amount monitoring light-receiving element 40.

When the amount of light received by the light amount monitoring light-receiving element 40 is extremely low, the diffusion plate 30 may be removed or damaged, and the light emitted from the 3D shape measurement light-emitting element array 20 may be directly radiated to the outside. In such a case, the light output of the 3D shape measurement light-emitting element array 20 is reduced by the second drive unit 50B via the optical device control unit 8. For example, radiation of light from the 3D shape measurement light-emitting element array 20 is stopped.

In the light-emitting device 4, the first drive unit 50A drives the proximity detection light-emitting element array 10 to emit light for detecting proximity of the object to be measured. The second drive unit 50B drives the 3D shape measurement light-emitting element array 20 to emit light for measuring a 3D shape of the object to be measured. The light amount monitoring light-receiving element 40 receives light reflected by the diffusion plate 30 among the light emitted from the 3D shape measurement light-emitting element array 20, and monitors a light output of the 3D shape measurement light-emitting element array 20. The light output of the 3D shape measurement light-emitting element array 20 is controlled via the second drive unit 50B based on the light output of the 3D shape measurement light-emitting element array 20 that is monitored by the light amount monitoring light-receiving element 40. The light amount monitoring light-receiving element 40 may monitor a light output of the proximity detecting light-emitting element array 10 in a similar manner to the 3D shape measurement light-emitting element array 20.

(Configurations of Proximity Detection Light-Emitting Element Array 10 and 3D Shape Measurement Light-Emitting Element Array 20)

Figure 4:
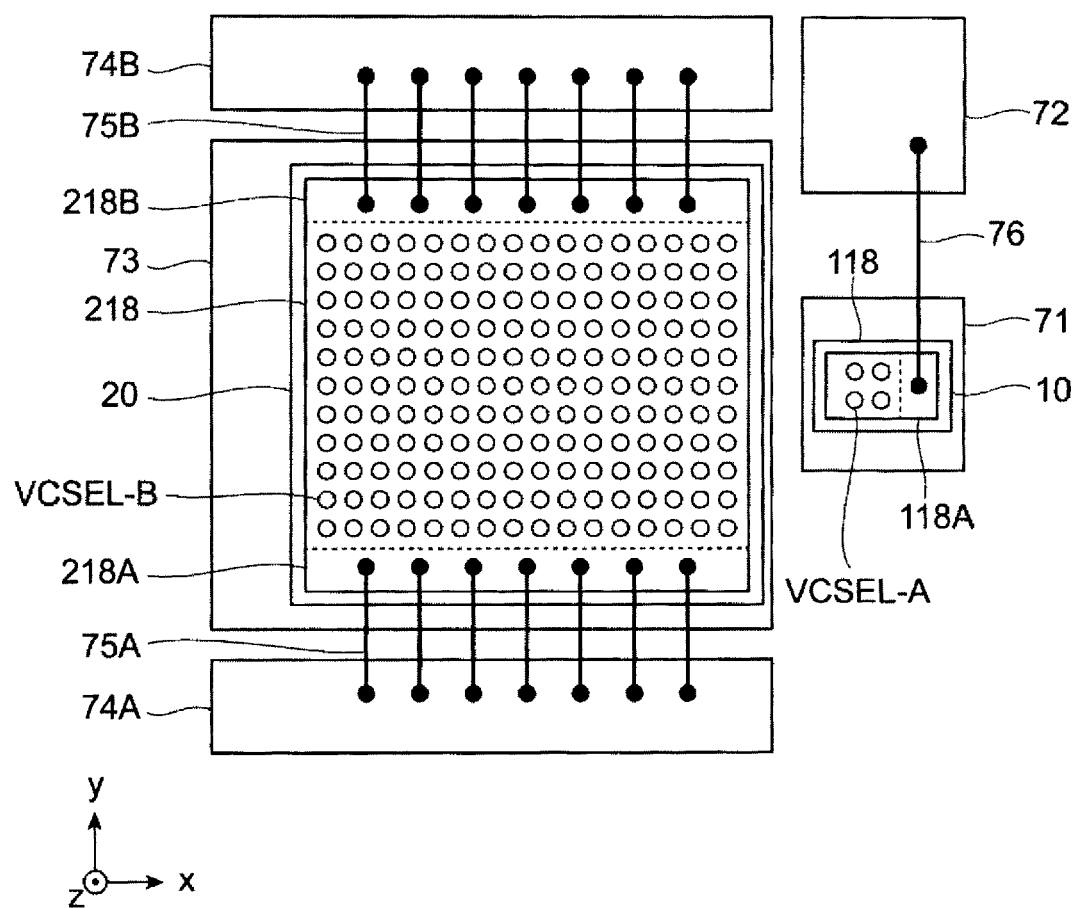
FIG. 4 is a diagram showing configurations of a proximity detection light-emitting element array and a 3D shape measurement light-emitting element array.

FIG. 4 is a diagram showing configurations of the proximity detection light-emitting element array 10 and the 3D shape measurement light-emitting element array 20. The proximity detection light-emitting element array 10 includes a vertical cavity surface emitting laser element VCSEL (vertical cavity surface emitting laser)-A. On the other hand, the 3D shape measurement light-emitting element array 20 includes a vertical cavity surface emitting laser element VCSEL-B. Hereinafter, the vertical cavity surface emitting laser element VCSEL-A is simply referred to as VCSEL-A, and the vertical cavity surface emitting laser element VCSEL-B is simply referred to as VCSEL-B. When the VCSEL-A and the VCSEL-B are not distinguished from each other, the VCSEL-A and the VCSEL-B are referred to as a VCSEL. The VCSEL-A is an example of a first light-emitting element, and the VCSEL-B is an example of a second light-emitting element.

Since the VCSEL is a light-emitting element in which an active region serving as a light-emitting region is provided between a lower multilayer film reflector and an upper multilayer film reflector that are stacked on a substrate and laser light is emitted in a direction perpendicular to the substrate, it is easy to form an array in which VCSELs are two-dimensionally arranged. Here, the proximity detection light-emitting element array 10 includes one or more VCSELs-A, and the 3D shape measurement light-emitting element array 20 includes plural VCSELs-B.

The VCSEL-A of the proximity detection light-emitting element array 10 emits light for detecting whether the object to be measured comes close to the information processing device 1. The VCSEL-B of the 3D shape measurement light-emitting element array 20 emits light for measuring a 3D shape of the object to be measured. When face authentication is taken as an example, a measurement distance is about 10 cm to about 1 m. A range in which the 3D shape of the object to be measured is measured (hereinafter, referred to as a measurement range or an irradiation range, and this range is referred to as an irradiation surface) is about 1 m square.

In this case, the number of the VCSELs-A of the proximity detection light-emitting element array 10 is 1 or more and 50 or less, and the number of the VCSELs-B of the 3D shape measurement light-emitting element array 20 is 100 or more and 1000 or less. That is, the number of the VCSELs-B of the 3D shape measurement light-emitting element array 20 is larger than the number of the VCSELs-A of the proximity detection light-emitting element array 10. As will be described later, the plural VCSELs-A of the proximity detection light-emitting element array 10 are connected in parallel to one another and are driven in parallel. Similarly, the plural VCSELs-B of the 3D shape measurement light-emitting element array 20 are connected in parallel to one another and are driven in parallel. The number of VCSELs described above is an example, and may be set according to a measurement distance or a measurement range. For example, the proximity detection light-emitting element array 10 shown in FIG. 4 includes four VCSELs-A.

The proximity detection light-emitting element array 10 does not need to radiate light onto the entire surface in a measurement range, and may detect whether the object to be measured comes close in the measurement range. Therefore, the proximity detection light-emitting element array 10 may radiate light to a part of the measurement range. Therefore, the number of VCSELs-A of the proximity detection light-emitting element array 10 may be small. In order to detect whether the object to be measured comes close to the information processing device 1, the proximity detection light-emitting element array 10 radiates light to the measurement range at a predetermined cycle when there is a use request of the information processing device 1. Therefore, the proximity detection light-emitting element array 10 is required to have low power consumption.

When it is detected that the object to be measured comes close in the measurement range, the 3D shape measurement light-emitting element array 20 radiates light onto the entire surface in the measurement range. The 3D sensor 6 specifies a 3D shape based on reflected light received from the measurement range. Therefore, the VCSEL-B of the 3D shape measurement light-emitting element array 20 is required to emit a large amount of light, and the 3D shape measurement light-emitting element array 20 includes a large number of VCSELs-B in order to uniformly radiate light onto the entire surface in the measurement range. Since the 3D shape measurement light-emitting element array 20 emits light only when a 3D shape is to be measured, the 3D shape measurement light-emitting element array 20 is allowed even when power consumption is high.

(Structure of VCSEL-A of Proximity Detection Light-Emitting Element Array 10)

Next, a structure of the VCSEL-A of the proximity detection light-emitting element array 10 will be described.

The proximity detection light-emitting element array 10 radiates light for detecting whether the object to be measured comes close. Therefore, the VCSEL-A of the proximity detection light-emitting element array 10 may have a low output, and a light density at a predetermined distance may be a predetermined value. That is, the light density may be set such that reflected light from the object to be measured is reliably detected by the 3D sensor 6 with low power consumption. Therefore, the VCSEL-A is required to have a small spread angle of emitted light and a small decrease in the light density relative to a distance.

The light density refers to an irradiance.

Here, for example, a single mode VCSEL that oscillates in a single transverse mode, that is, a single mode, is used as the VCSEL-A of the proximity detection light-emitting element array 10. The single mode VCSEL has a smaller spread angle of emitted light than a multi-mode VCSEL that oscillates in a multiple transverse mode, that is, a multi-mode. Therefore, even when light outputs are the same, the single mode VCSEL has a higher light density on an irradiation surface than the multi-mode VCSEL. A spread angle of emitted light refers to a full width at half maximum (FWHM) of light emitted from a VCSEL (see 01 and 02 in FIG. 8B). The single transverse mode refers to a mode in which an intensity profile of emitted light with a spread angle as a parameter has a unimodal characteristic, that is, a characteristic in which the number of an intensity peak is one. The single transverse mode may include, for example, plural transverse modes within a range in which the unimodal characteristic is maintained.

A VCSEL having a long cavity structure may be used as the single mode VCSEL.

In the VCSEL having a long cavity structure, a spacer layer of several $\lambda$ to several tens of $\lambda$ is introduced between an active region in a VCSEL having a general $\lambda$ cavity structure in which a cavity length is an oscillation wavelength $\lambda$ and one multilayer reflector to increase the cavity length. Accordingly, the VCSEL having a long cavity structure increases a loss in a high-order transverse mode, and a single mode oscillation may be performed with an oxidation aperture diameter larger than an oxidation aperture diameter of the VCSEL having the general $\lambda$ cavity structure. In a VCSEL having a typical $\lambda$ cavity structure, since a longitudinal mode interval (may be referred to as a free spectrum range) is large, a stable operation may be obtained in a single longitudinal mode. On the other hand, in the case of the VCSEL having a long cavity structure, a longitudinal mode interval is narrowed by increasing the cavity length, and standing waves that are plural longitudinal modes are present in the cavity, and as a result, switching between the longitudinal modes is likely to occur. Therefore, in the VCSEL having a long cavity structure, it is required to prevent switching between the longitudinal modes.

It is easier to set the VCSEL having a long cavity structure to have a smaller spread angle than that of a single mode VCSEL having a typical $\lambda$ cavity structure.

Figure 5:
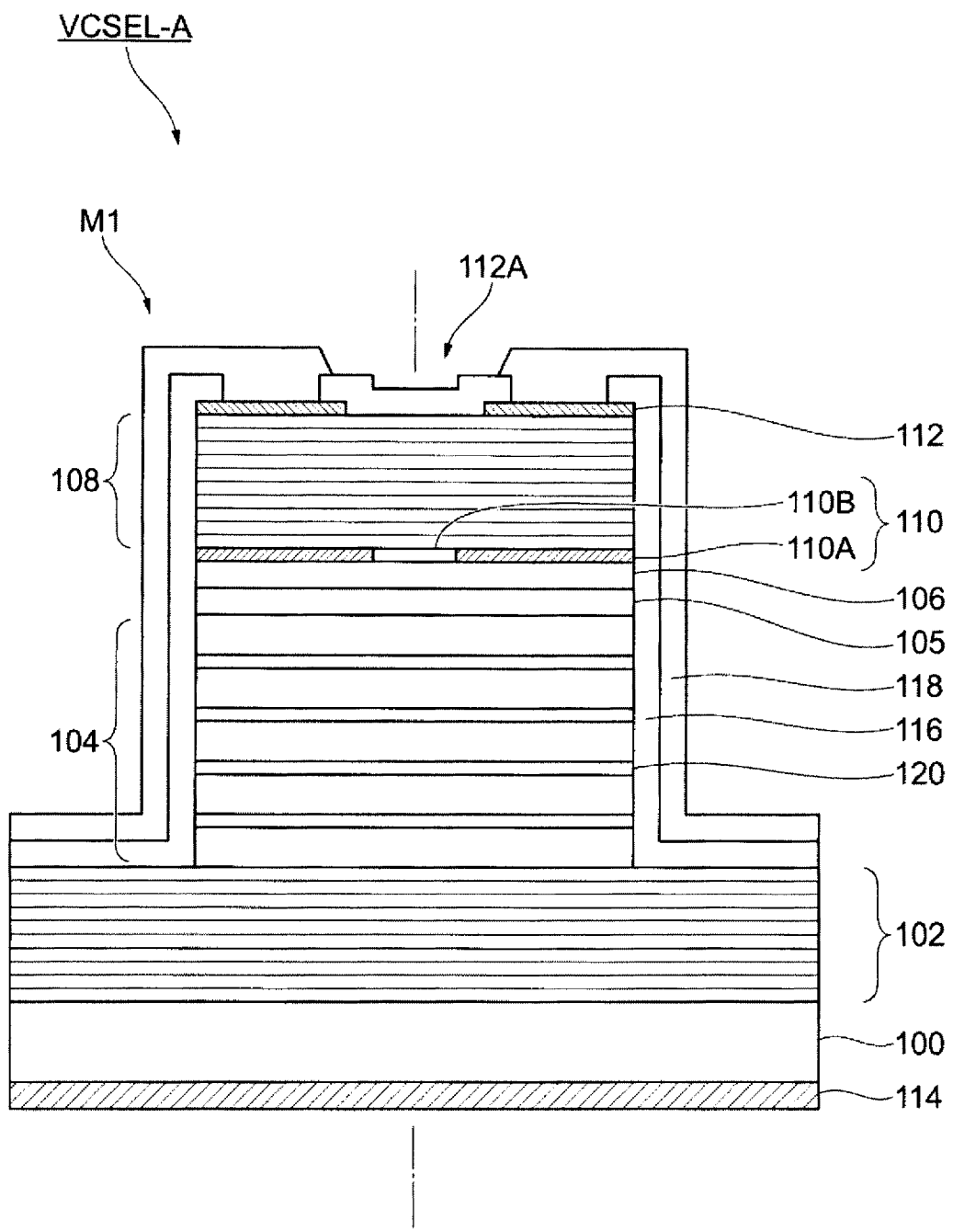
FIG. 5 is a diagram showing a cross-sectional structure of one VCSEL in the proximity detection light-emitting element array.

FIG. 5 is a diagram showing a cross-sectional structure of one VCSEL-A in the proximity detection light-emitting element array 10. The VCSEL-A is a VCSEL having a long cavity structure.

The VCSEL-A is formed by stacking, on an n-type GaAs substrate 100, an n-type lower Distributed Bragg Reflector (DBR) 102, a cavity extended region 104 that is formed on the lower DBR 102 and extends a cavity length, an n-type carrier block layer 105 formed on the cavity extended region 104, an active region 106 formed on the carrier block layer 105, and a p-type upper DBR 108 formed on the active region 106. The n-type lower DBR 102 is formed by alternately stacking AlGaAs layers having different Al compositions. The active region 106 includes a quantum well layer interposed between an upper spacer layer and a lower spacer layer. The p-type upper DBR 108 is formed by alternately stacking AlGaAs layers having different Al compositions.

The n-type lower DBR 102 is a multilayer stacked body in which an $Al_{0.9}Ga_{0.1}As$ layer and a GaAs layer are paired, and a thickness of each layer is $\lambda/4n_r$ (in which $\lambda$ is an oscillation wavelength and $n_r$ is a refractive index of a medium). These layers are alternately stacked in 40 cycles. A carrier concentration after doping with silicon that is an n-type impurity is, for example, $3 \times 10^{18}$ $cm^{-3}$.

The cavity extended region 104 is a monolithic layer formed by a series of epitaxial growth. Therefore, the cavity extended region 104 is made of AlGaAs, GaAs, or AlAs whose lattice constant coincides or matches that of a GaAs substrate. Here, the cavity extended region 104 is made of AlGaAs that does not cause light absorption so as to emit laser light in a 940 nm band. A film thickness of the cavity extended region 104 is set to about 2 μm or more and 5 μm or less, and is set to 5λ or more and 20λ or less of the oscillation wavelength λ. Therefore, a movement distance of a carrier is increased. Therefore, the cavity extended region 104 may be an n-type region having a high carrier mobility, and thus the cavity extended region 104 is inserted between the n-type lower DBR 102 and the active region 106. Such a cavity extended region 104 may be referred to as a cavity extended region or a cavity space.

The carrier block layer 105 that has a large band gap and may be made of, for example, $Al_{0.9}Ga_{0.1}As$ is formed between the cavity extended region 104 and the active region 106. A carrier leakage from the active region 106 is prevented and light emission efficiency is improved by inserting the carrier blocking layer 105. As will be described later, since an optical loss causing layer 120 in which an oscillation intensity of laser light is slightly attenuated is inserted into the cavity extended region 104, the carrier block layer 105 plays a role of compensating for such a loss. For example, a film thickness of the carrier block layer 105 is $\lambda/4$ $mn_r$ ($\lambda$ is an oscillation wavelength, m is an integer, and $n_r$ is a refractive index of a medium).

The active region 106 is configured by stacking a lower spacer layer, a quantum well active layer, and an upper spacer layer. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 108 is a stacked body of a p-type $Al_{0.9}Ga_{0.1}As$ layer and a GaAs layer, a thickness of each layer is $\lambda/4n_r$, and these layers are alternately stacked in 29 cycles. A carrier concentration after doping with carbon that is a p-type impurity is, for example, $3 \times 10^{18}$ $cm^{-3}$. A contact layer made of p-type GaAs may be formed on an uppermost layer of the upper DBR 108, and a p-type AlAs current confinement layer 110 is formed on a lowermost layer of the upper DBR 108 or in the upper DBR 108.

Stacked semiconductor layers from the upper DBR 108 to the lower DBR 102 are etched, so that a cylindrical mesa M1 is formed on the substrate 100, and the current confinement layer 110 is exposed at a side surface of the mesa M1. An oxidized region 110A selectively oxidized from the side surface of the mesa M1 and a conductive region 110B surrounded by the oxidized region 110A are formed in the current confinement layer 110. The conductive region 110B is an oxidized aperture. In an oxidation step, an AlAs layer has a higher oxidation rate than an AlGaAs layer, and the oxidized region 110A is oxidized from the side surface toward an inner side of the mesa M1 at a substantially constant rate, so that a planar shape of the conductive region 110B parallel to the substrate is a shape that reflects an outer shape of the mesa M1, that is, a circular shape, and a center of the shape substantially coincides with an axial direction of the mesa M1 indicated by a dashed-dotted line. In the VCSEL-A having a long cavity structure, a diameter of the conductive region 110B for obtaining a single transverse mode may be made larger than that of a VCSEL having a typical λ cavity structure, and for example, the diameter of the conductive region 110B may be made large to an extent about 7 μm or more and 8 μm or less.

An annular p-side electrode 112 made of a metal in which Ti, Au, or the like is stacked is formed on an uppermost layer of the mesa M1. The p-side electrode 112 is in ohmic contact with a contact layer of the upper DBR 108. An inner inside of the annular p-side electrode 112 serves as a light emission port 112A through which laser light is emitted to the outside. That is, a central axis direction of the mesa M1 is an optical axis. Further, a cathode electrode 114 serving as an n-side electrode is formed on a back surface of the substrate 100. A front surface of the upper DBR 108 including the light emission port 112A is an emission surface.

An insulating layer 116 is provided in a manner of covering a front surface of the mesa M1 except for a portion where the p-side electrode 112 and an anode electrode 118 to be described later are connected and the light emission port 112A. The anode electrode 118 is provided in a manner of coming into ohmic contact with the p-side electrode 112 except for the light emission port 112A. The anode electrode 118 is provided at a position of each of the plural VCSELs-A other than a position where the light emission port 112A is provided. That is, in the plural VCSELs-A of the proximity detection light-emitting element array 10, the respective p-side electrodes 112 are connected in parallel by the anode electrode 118.

In the VCSEL having a long cavity structure, since plural longitudinal modes may be present in a reflection band defined by a cavity length, it is required to prevent switching or popping between the longitudinal modes. Here, an oscillation wavelength band of a required longitudinal mode is set to 940 nm, and the optical loss causing layer 120 for standing waves of an unnecessary longitudinal mode is provided in the cavity extended region 104 so as to prevent switching to an oscillation wavelength band of a longitudinal mode other than the required longitudinal mode. That is, the optical loss causing layer 120 is introduced at a position of a node of standing waves of the required longitudinal mode. The optical loss causing layer 120 is made of a semiconductor material having the same Al composition as a semiconductor layer constituting the cavity extended region 104. For example, the layer 120 is made of $Al_{0.3}Ga_{0.7}As$. The optical loss causing layer 120 may have a higher impurity doping concentration than the semiconductor layer constituting the cavity extended region 104. For example, when an impurity concentration of AlGaAs constituting the cavity extended region 104 is $1 \times 10^{17}$ cm$^{-3}$, the optical loss causing layer 120 has an impurity concentration of $1 \times 10^{18}$ cm$^{-3}$, and the optical loss causing layer 120 is configured such that the impurity concentration is higher by about one order of magnitude than that of other semiconductor layers. When the impurity concentration is increased, absorption of light by a carrier is increased, which causes a loss. A film thickness of the optical loss causing layer 120 is selected so that a loss to the required longitudinal mode does not increase, and the optical loss causing layer 120 may have a film thickness (about 10 nm or more and 30 nm or less) substantially the same as a film thickness of the current confinement layer 110 positioned at a node of standing waves.

The optical loss causing layer 120 is inserted into standing waves of the required longitudinal mode in a manner of being positioned at a node of the standing waves. Since the node of the standing waves is weak in intensity, a loss influence of the optical loss causing layer 120 on the required longitudinal mode is small. On the other hand, for standing waves in an unnecessary longitudinal mode, the optical loss causing layer 120 is located at an antinode other than a node. Since the antinode of standing waves has a higher intensity than the node, a loss given to the unnecessary longitudinal mode by the optical loss causing layer 120 is large. In this manner, since a loss to the required longitudinal mode is reduced and a loss to the unnecessary longitudinal mode is increased, the unnecessary longitudinal mode is selectively prevented from resonating, and hopping between longitudinal modes is prevented.

The optical loss causing layer 120 does not necessarily need to be provided at a position of a node of standing waves of the required longitudinal mode in the cavity extended region 104, and the optical loss causing layer 120 may be a single layer. In this case, since an intensity of standing waves increases as coming close to the active region 106, the optical loss causing layer 120 may be formed at a position of a node close to the active region 106. When switching or popping between longitudinal modes is allowed, the optical loss causing layer 120 may not be provided.

(VCSEL-B of 3D Shape Measurement Light-Emitting Element Array 20)

Next, the VCSEL-B of the 3D shape measurement light-emitting element array 20 will be described.

The 3D shape measurement light-emitting element array 20 radiates light for specifying the 3D shape of the object to be measured, and radiates light having a predetermined light density to a predetermined measurement range. Therefore, the VCSEL-B of the 3D shape measurement light-emitting element array 20 may be configured with a multi-mode VCSEL that is more likely to have a larger output than a single mode VCSEL.

Figure 6:
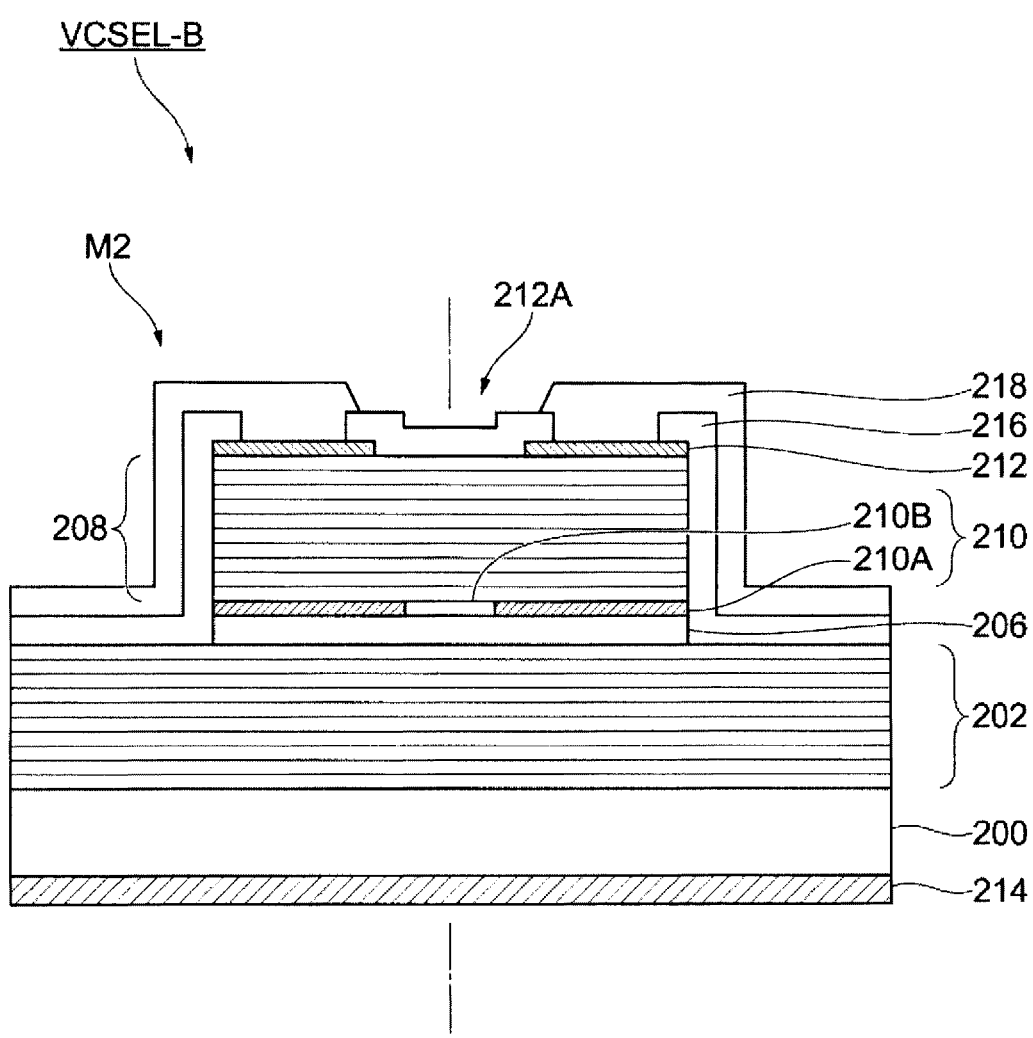
FIG. 6 is a diagram showing a cross-sectional structure of one VCSEL in the 3D shape measurement light-emitting element array.

FIG. 6 is a diagram showing a cross-sectional structure of one VCSEL-B in the 3D shape measurement light-emitting element array 20. The VCSEL-B is a VCSEL having a general λ cavity structure as described above. That is, the VCSEL-B does not include the cavity extended region 104 in the VCSEL-A described above.

The VCSEL-B is formed by stacking, on an n-type GaAs substrate 200, an n-type lower DBR 202 in which AlGaAs layers having different Al compositions are alternately stacked, an active region 206 that is formed on the lower DBR 202 and includes a quantum well layer interposed between an upper spacer layer and a lower spacer layer, and a p-type upper DBR 208 that is formed on the active region 206 and in which AlGaAs layers having different Al compositions are alternately stacked. A current confinement layer 210 of p-type AlAs is formed on a lowermost layer of the upper DBR 208 or in the upper DBR 208.

Since the lower DBR 202, the active region 206, the upper DBR 208, and the current confinement layer 210 are the same as the lower DBR 102, the active region 106, the upper DBR 108, and the current confinement layer 110 of the VCSEL-A described above, description thereof will be omitted.

Stacked semiconductor layers from the upper DBR 208 to the lower DBR 202 are etched, so that a cylindrical mesa M2 is formed on the substrate 200, and the current confinement layer 210 is exposed at a side surface of the mesa M2. An oxidized region 210A selectively oxidized from the side surface of the mesa M2 and a conductive region 210B surrounded by the oxidized region 210A are formed in the current confinement layer 210. The conductive region 210B is an oxidized aperture. A planar shape of the conductive region 210B parallel to the substrate is a shape that reflects an outer shape of the mesa M2, that is, a circular shape, and a center of the shape substantially coincides with an axial direction of the mesa M2 indicated by a dashed-dotted line.

An annular p-side electrode 212 made of metal in which Ti, Au or the like is stacked is formed on an uppermost layer of the mesa M2, and the p-side electrode 212 is in ohmic contact with a contact layer of the upper DBR 208. A circular light emission port 212A whose center coincides with the axial direction of the mesa M2 is formed in the p-side electrode 212, and laser light is emitted to the outside from the light emission port 212A. That is, the axial direction of the mesa M2 is an optical axis. Further, a cathode electrode 214 serving as an n-side electrode is formed on a back surface of the substrate 200. A front surface of the upper DBR 208 including the light emission port 212A is an emission surface.

An insulating layer 216 is provided in a manner of covering a front surface of the mesa M2 except for a portion where the p-side electrode 212 and an anode electrode 218 to be described later are connected and the light emission port 212A. The anode electrode 218 is provided in a manner of coming into ohmic contact with the p-side electrode 212 except for the light emission port 212A. The anode electrode 218 is provided at a position of each of the plural VCSELs-B other than a position where the light emission port 212A is provided. That is, in the plural VCSELs-B constituting the 3D shape measurement light-emitting element array 20, the respective p-side electrodes 212 are connected in parallel by the anode electrode 218.

FIG. 7 is a diagram showing a relationship between a light output and a power conversion efficiency of a general VCSEL.

In general, VCSELs have a maximum power conversion efficiency when a light output of one VCSEL is 4 mW or more and 8 mW or less. As compared with a case where a VCSEL is used in a range in which a light output is smaller than the above range, a spread angle of emitted light is increased, and a light density on an irradiation surface does not increase in proportion to an increase in the light output.

Here, the VCSEL-A of the proximity detection light-emitting element array 10 may be driven so as to have a light output range in which the power conversion efficiency decreases. That is, the VCSEL-A of the proximity detection light-emitting element array 10 is intentionally caused to emit light at a light output lower than a range in which the power conversion efficiency is maximized, so that the VCSEL-A emits light at a small spread angle. When a light density is insufficient on an irradiation surface, a light output per VCSEL-A is not increased. The light density may be increased while maintaining a small spread angle by increasing the number of VCSELs-A. For example, a light output of one VCSEL-A is set to 1 mW or more and 4 mW or less. The number of VCSEL-A in the proximity detection light-emitting element array 10 is, for example, 1 or more and 50 or less. In the configuration shown in FIG. 4, as described above, in order to increase a light density while avoiding a range (4 mW or more and 8 mW or less) in which the power conversion efficiency is maximized, the proximity detection light-emitting element array 10 includes plural VCSELs-A.

On the other hand, the VCSEL-B of the 3D shape measurement light-emitting element array 20 may be driven so as to have a light output range in which the power conversion efficiency is maximized. For example, a light output of one VCSEL-B is set to 4 mW or more and 8 mW or less. The number of VCSELs-B in the 3D shape measurement light-emitting element array 20 is, for example, 100 more and 1000 or less.

(Configuration of Diffusion Plate 30)

Next, the diffusion plate 30 will be described.

Figure 8A:
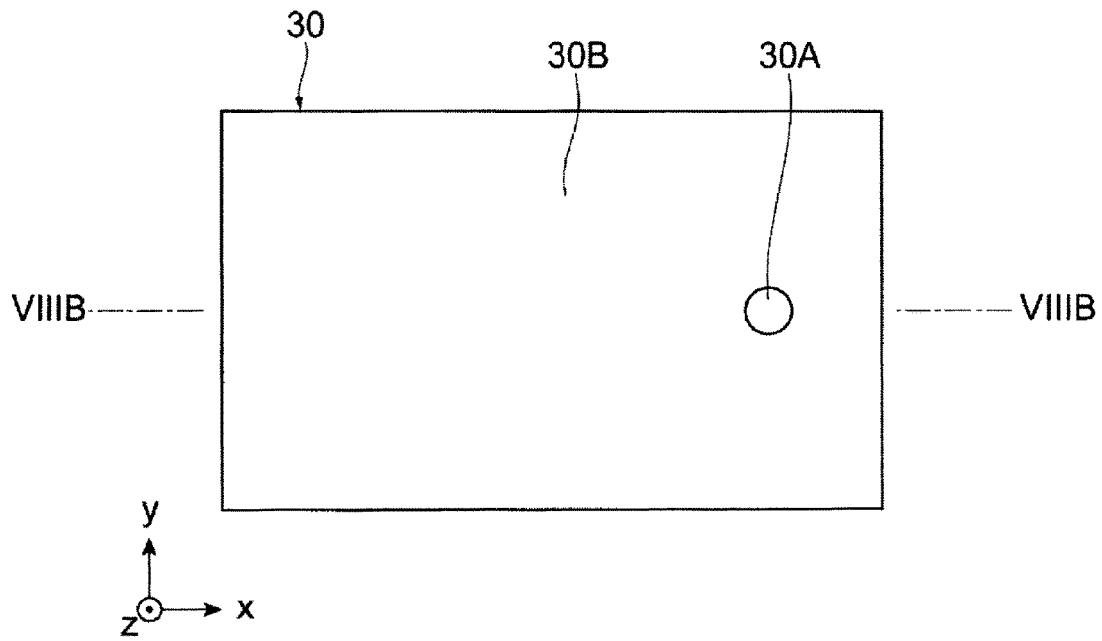
FIG. 8A is a plan view of an example of a configuration of a diffusion plate.
Figure 8B:
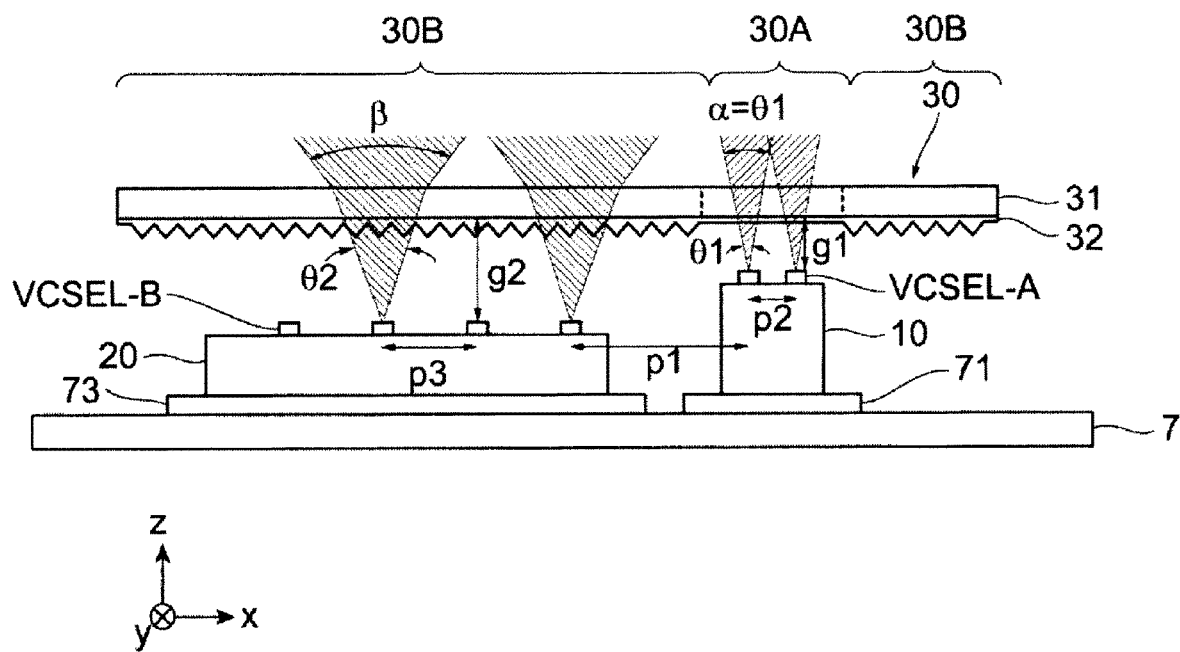
FIG. 8B is a cross-sectional view taken along a line VIIIB-VIIIB in FIG. 8A.

FIGS. 8A and 8B are a diagram showing an example of a configuration of the diffusion plate 30. FIG. 8A is a plan view, and FIG. 8B is a cross-sectional view taken along a line VIIIB-VIIIB in FIG. 8A.

As shown in FIGS. 3A and 3B, the diffusion plate 30 is provided at a side where the proximity detection light-emitting element array 10 and the 3D shape measurement light-emitting element array 20 emit light, and diffuses the light emitted from the proximity detection light-emitting element array 10 and the light emitted from the 3D shape measurement light-emitting element array 20. The diffusion plate 30 has a function of further expanding a spread angle of light incident on the diffusion plate 30.

As shown in FIG. 8A, the diffusion plate 30 includes a first region 30A and a second region 30B. In other words, the first region 30A and the second region 30B are formed as an integrated member. The first region 30A is provided on an emission path of light from the VCSEL-A of the proximity detection light-emitting element array 10, and the second region 30B is provided on an emission path of light from the 3D shape measurement light-emitting element array 20. That is, as shown in FIG. 3A, when the light-emitting device 4 is viewed from a front surface (in a plan view), the first region 30A of the diffusion plate 30 is provided in a manner of facing a position where the proximity detection light-emitting element array 10 is disposed, and the second region 30B of the diffusion plate 30 is provided in a manner of facing the 3D shape measurement light-emitting element array 20. In the case where the proximity detection light-emitting element array 10 and the 3D shape measurement light-emitting element array 20 are covered with the common diffusion plate 30, when light from the proximity detection light-emitting element array 10 is also diffused by the diffusion plate 30, it is difficult to perform a proximity detection. Therefore, in order to use the common diffusion plate 30, the diffusion plate 30 is provided with the first region 30A and the second region 30B as described above. In the present exemplary embodiment, the proximity detection light-emitting element array 10 and the 3D shape measurement light-emitting element array 20 are disposed close to each other. This is because when the proximity detection light-emitting element array 10 and the 3D shape measurement light-emitting element array 20 are separated far from each other with a distance, an unnecessarily large diffusion plate is required when the common (integrated) diffusion plate 30 is adopted. As described above, the small diffusion plate 30 in which the first region 30A and the second region 30B are integrated is adopted in the present exemplary embodiment.

A diffusion angle of the second region 30B is set to be larger than that of the first region 30A in the diffusion plate 30. For example, as shown in FIG. 8B, the diffusion plate 30 includes a resin layer 32 in which unevenness for diffusing light is formed on one surface of a flat glass base member 31 of which both surfaces are parallel to each other. However, the first region 30A and the second region 30B are different from each other in shapes of the unevenness, and the diffusion angle of the second region 30B is set to be large. The diffusion angle is a spread angle of light transmitted through the diffusion plate 30.

Here, the first region 30A is not provided with unevenness, and is formed so that light is not diffused by the first region 30A. The resin layer 32 in which the unevenness is provided in the second region 30B is made flat without providing the unevenness in the first region 30A, or the surface of the flat glass base member 31 of which both surfaces are parallel to each other is exposed in the first region 30A. Here, the first region 30A does not need to be completely flat, and an uneven shape may be provided as long as the diffusion angle of the first region 30A is smaller than that of the second region 30B. The first region 30A of the diffusion plate 30 may be a through hole through which light passes. In the case of the through hole, light is not diffused in a similar manner to the case where the first region 30A is flat. As described above, a member having a diffusion function, that is, a light diffusion member may be provided on the emission path of the 3D shape measurement light-emitting element array 20.

Then, as shown in FIG. 8B, the VCSEL-A of the proximity detection light-emitting element array 10 is disposed at a position facing the first region 30A of the diffusion plate 30. On the other hand, the VCSEL-B of the 3D shape measurement light-emitting element array 20 is disposed at a position facing the second region 30B of the diffusion plate 30. A spread angle of emitted light of the VCSEL-A is $\theta 1$, and a spread angle of emitted light of the VCSEL-B is $\theta 2$. $\theta 1$ is smaller than $\theta 2$ ($\theta 1 < \theta 2$).

When light emitted from the VCSEL-A passes through the first region 30A where the unevenness is not provided, the light is not diffused and passes through the first region 30A in a state in which the spread angle $\theta 1$ of the emitted light is maintained and is equal to a diffusion angle $\alpha$.

On the other hand, when light emitted from the VCSEL-B passes through the second region 30B provided with the unevenness, light is diffused and light having a diffusion angle $\beta$ that is larger than the spread angle $\theta 2$ of the emitted light is emitted from the diffusion plate 30.

The spread angles $\theta 1$ and $\theta 2$ and the diffusion angles $\alpha$ and $\beta$ are full width at half maximum (FWHM).

As described above, the diffusion plate 30 is configured such that the diffusion angle of the first region 30A is smaller than the diffusion angle of the second region 30B. In this manner, the light emitted from the VCSEL-B of the 3D shape measurement light-emitting element array 20 is further diffused in the second region 30B and is emitted to the outside. Accordingly, as compared with a case where light emitted from the VCSEL-B is emitted to the outside without being diffused in the second region 30B, an irradiation pattern having more uniformity may be obtained on a wider irradiation surface. The second region 30B may be configured to have a uniform diffusion angle over the entire second region 30B, or may be configured to have different diffusion angles depending on a position in the second region 30B. The second region 30B may be configured such that an optical axis of the VCSEL-B coincides with a central axis of diffused light, or may be configured such that the central axis of the diffused light is intentionally shifted relative to the optical axis of the VCSEL-B to increase an irradiation area.

The first region 30A may be provided with an optical element that reduces the spread angle θ1 of light emitted from the VCSEL-A of the proximity detection light-emitting element array 10. Such an optical element may be obtained by, for example, setting the first region 30A into a convex lens shape. Here, reducing the spread angle includes not only a case where incident light is condensed, but also a case where incident light is set to be parallel light and is diffused, but a degree of diffusion is reduced.

A size of the first region 30A may be determined in consideration of the number of the VCSELs-A of the proximity detection light-emitting element array 10, a spread angle θ of emitted light, an intensity of emitted light, or the like. For example, in a case where the proximity detection light-emitting element array 10 is used for face authentication, when the proximity detection chip 10 is configured such that, for example, the number of the VCSELs-A is in a range of one or more and 50 or less, the first region 30A may have a lateral width and a vertical width in a range of 50 μm or more and 500 μm or less. Although a front surface shape of the first region 30A in a plan view is circular in FIG. 8A, the front surface shape of the first region 30A may be a square, a rectangle, a polygon, or a combination of the above shapes. The lateral width and the vertical width of the first region 30A, that is, a size of the first region 30A may be set based on an output of light emitted from the proximity detection light-emitting element array 10. For example, the lateral width and the vertical width of the first region 30A may be set to be in a range larger than a region of full width at half maximum of the light emitted from the proximity detection light-emitting element array 10 or a range smaller than a region having an intensity of 0.1%. When it is desired to arrange the VCSEL-A and the VCSEL-B to be close to each other, the lateral width and the longitudinal width of the first region 30A may be set to be in a range smaller than a region having an intensity of 1% or a range smaller than a region having an intensity of 5%.

The size of the diffusion plate 30 including the first region 30A and the second region 30B may be set such that, for example, a lateral width and a vertical width are 1 mm or more and 10 mm or less and a thickness is 0.1 mm or more and 1. The diffusion plate 30 may cover the proximity detection light-emitting element array 10, the 3D shape measurement light-emitting element array 20, and the light amount monitoring light-receiving element 40 in a plan view. Although an example in which the diffusion plate 30 has a quadrangle shape in a plan view is described, the diffusion plate 30 may have another shape such as a polygonal shape and a circular shape. When the diffusion plate 30 has the size and the shape as described above, a light diffusion member suitable for, in particular, face authentication of a portable information processing terminal and a relatively short distance measurement up to about several meters is provided.

(Positional Relationship Among Diffusion Plate 30, VCSEL-A of Proximity Detection Light-Emitting Element Array 10, and VCSEL-B of 3D Shape Measurement Light-Emitting Element Array 20)

A positional relationship between the VCSEL-A of the proximity detection light-emitting element array 10 and the VCSEL-B of the 3D shape measurement light-emitting element array 20 will be described with reference to FIG. 8B. Here, an interval between the VCSEL-A of the proximity detection light-emitting element array 10 and the VCSEL-B of the 3D shape measurement light-emitting element array 20 that are adjacent to each other is defined as p1, an interval between the VCSELs-A of the proximity detection light-emitting element array 10 is defined as p2, and an interval between the VCSELs-B of the 3D shape measurement light-emitting element array 20 is defined as p3.

At this time, as can be seen from FIG. 8B, when the VCSEL-B is too close to the proximity detection light-emitting element array 10, that is, the interval p1 is small, light having a large light intensity emitted from the VCSEL-B passes through the first region 30A of the diffusion plate 30, and the light is likely to be emitted to the outside in a state in which the light is not diffused or diffusion is weak. Therefore, a distance may be provided between the VCSEL-A and the VCSEL-B that are adjacent to each other. For example, the VCSEL-B of the 3D shape measurement light-emitting element array 20 adjacent to the first region 30A of the diffusion plate 30 may be disposed such that a range of the spread angle θ2 of the emitted light does not overlap the first region 30A of the diffusion plate 30. In this manner, as compared with a case where the range of the spread angle θ2 of light emitted from the VCSEL-B of the 3D shape measurement chip 20 overlaps the first region 30A of the diffusion plate 30, an amount of light that is emitted from the VCSEL-B of the 3D shape measurement light-emitting element array 20 and passes through the first region 30A of the diffusion plate 30 is reduced.

For example, the interval p1 between the VCSEL-A of the proximity detection light-emitting element array 10 and the VCSEL-B of the 3D shape measurement light-emitting element array 20 that are adjacent to each other may be larger than the interval p3 between the VCSELs-B of the 3D shape measurement light-emitting element array 20.

The spread angle θ1 of light emitted from the VCSEL-A of the proximity detection light-emitting element array 10 is set to be smaller than the spread angle θ2 of light emitted from the VCSEL-B of the 3D shape measurement light-emitting element array 20. In a case where a distance from the light emission port 112A (see FIG. 5) of the VCSEL-A of the proximity detection light-emitting element array 10 to the diffusion plate 30 is defined as a distance g1 and the distance from the light emission port 212A of the VCSEL-B of the 3D shape measurement light-emitting element array 20 to the diffusion plate 30 is defined as a distance g2, when the distance g1 is set to be smaller than the distance g2 (g1<g2), that is, when the light emission port 112A of the VCSEL-A of the proximity detection light-emitting element array 10 is set to be closer to the diffusion plate 30 than the light emission port 212A of the VCSEL-B of the 3D shape measurement light-emitting element array 20, as shown in FIG. 8B, the light emitted from the VCSEL-A of the proximity detection light-emitting element array 10 is likely to pass through the first region 30A and is radiated onto the object to be measured even when the first region 30A of the diffusion plate 30 is small.

In this manner, it is easy to reduce an area of the first region 30A of the diffusion plate 30. As the area of the first region 30A is reduced, an amount of light that is emitted from the VCSEL-B of the 3D shape measurement light-emitting element array 20 and passes through the first region 30A is further reduced, so that the VCSEL-B of the 3D shape measurement light-emitting element array 20 may be disposed closer to the proximity detection light-emitting element array 10. That is, a region (dead space) in which the VCSEL-B cannot be disposed and that is generated between the VCSEL-A of the proximity detection light-emitting element array 10 and the VCSEL-B of the 3D shape measurement light-emitting element array 20 that are adjacent to each other is reduced, and a size of the diffusion plate 30 or the spacer 33 is reduced.

Since the VCSEL-B of the 3D shape measurement light-emitting element array 20 has a larger light output than the VCSEL-A of the proximity detecting light-emitting element array 10, temperature of the VCSEL-B is likely to rise. Therefore, when the interval p3 between the VCSELs-B of the 3D shape measurement light-emitting element array 20 is larger than the interval p2 between the VCSELs-A of the proximity detection light-emitting element array 10 (p3>p2), the temperature rise is prevented. On the other hand, since the VCSEL-A of the proximity detection light-emitting element array 10 has a smaller light output than the VCSEL-B of the 3D shape measurement light-emitting element array 20, temperature of the VCSEL-A is less likely to rise. Therefore, when the interval p2 that is a distance between the VCSELs-A of the proximity detection light-emitting element array 10 is smaller than the interval p3 that is a distance between the VCSELs-B of the 3D shape measurement light-emitting element array 20, an irradiation area of the proximity detection light-emitting element array 10 is likely to be reduced by an amount at which the interval P2 is smaller than the interval P3. When the irradiation area is reduced, a region where a light density is high on the irradiation surface is increased, and thus reflected light may be easily detected by the 3D sensor 6. That is, the proximity detection may be easily performed with power saving. Here, the interval p2 is an example of a first interval, and the interval p3 is an example of a second interval.

As shown in FIG. 8A, the first region 30A of the diffusion plate 30 may be surrounded by the second region 30B at four sides. In this manner, as compared with FIGS. 9A and 9B to be described later, light emitted from the VCSEL-B of the 3D shape measurement light-emitting element array 20 is prevented from passing through the first region of the diffusion plate 30.

Next, modifications of the diffusion plate 30 will be described.

Figure 9A:
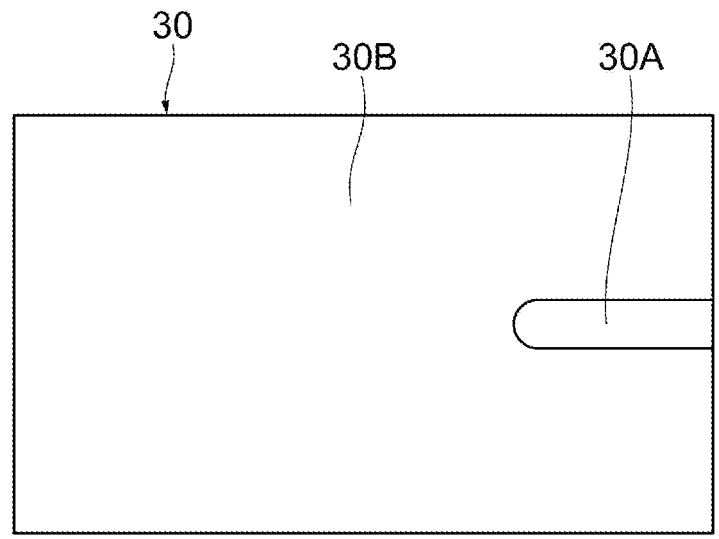
FIG. 9A is a diagram showing a first modification of the diffusion plate.
Figure 9B:
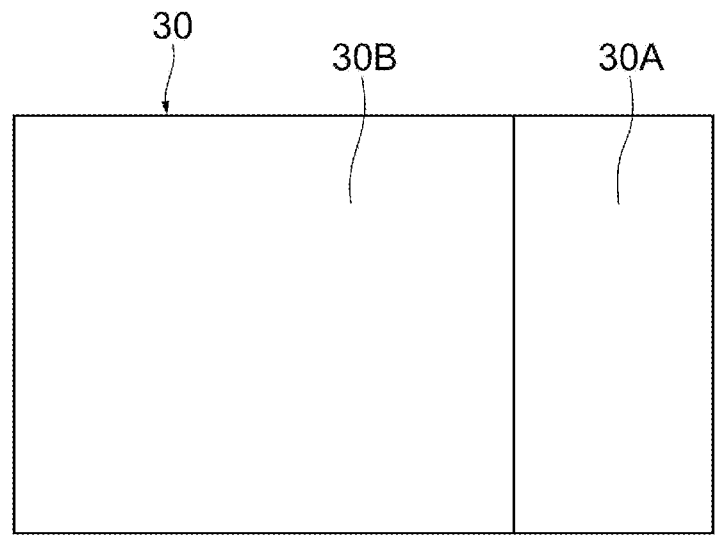
FIG. 9B is a diagram showing a second modification of the diffusion plate.

FIGS. 9A and 9B are diagrams showing modifications of the diffusion plate 30. FIG. 9A shows the diffusion plate 30 according to a first modification, and FIG. 9B shows the diffusion plate 30 according to a second modification.

In the first modification of the diffusion plate 30 shown in FIG. 9A, the planar shape of the first region 30A of the diffusion plate 30 is a slit shape extending in the +x direction. In this manner, a margin for the arrangement in the ±x direction is widened. Even in this case, since the first region is surrounded by the second region, the light emitted from the VCSEL-B of the 3D shape measurement light-emitting element array 20 is prevented from passing through the first region of the diffusion plate 30.

On the other hand, in the second modification of the diffusion plate 30 shown in FIG. 9B, the first region 30A of the diffusion plate 30 is provided at a right end portion (+x direction side) of the diffusion plate 30. In this case, since the first region is not surrounded by the second region, an amount of light passing through the first region 30A of the diffusion plate 30 among the light emitted from the VCSEL-B of the 3D shape measurement light-emitting element array 20 is increased as compared with the first modification of the diffusion plate 30. However, in a configuration on the premise that the light emitted from the VCSEL-B of the 3D shape measurement light-emitting element array 20 is allowed to pass through the first region 30A, such as a case where the light output of the VCSEL-B of the 3D shape measurement light-emitting element array 20 is small or a case where a distance between the VCSEL-B of the 3D shape measurement light-emitting element array 20 and the first region 30A is long in a plan view, the second modification of the diffusion plate 30 may be adopted. The light emitted from the VCSEL-B of the 3D shape measurement light-emitting element array 20 is prevented from passing through the first region of the diffusion plate 30.

Here, the matter that the first region is surrounded by the second region refers to that the second region 30B is present in at least two directions in a plan view.

(Configuration of 3D Sensor 6)

Figure 10:
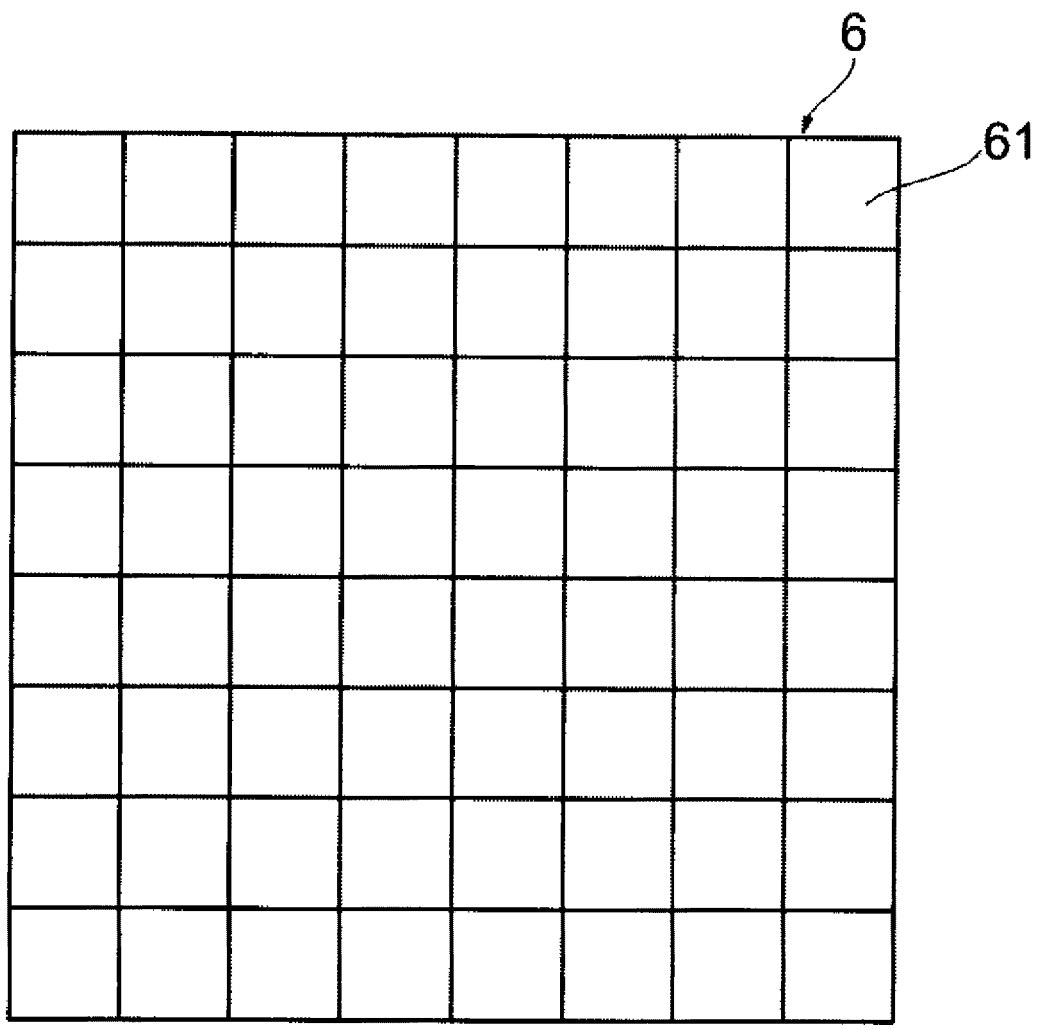
FIG. 10 is a diagram showing a 3D sensor.

FIG. 10 is a diagram showing the 3D sensor 6.

The 3D sensor 6 includes plural light-receiving regions 61 arranged in a matrix (lattice). The 3D sensor 6 receives a received light pulse that is reflected light obtained by the object to be measured reflecting a light pulse emitted from the light-emitting device 4, and accumulates, in each light-receiving region 61, electric charges corresponding to a time until the received light pulse is received. For example, the 3D sensor 6 is configured as a device having a CMOS structure in which each light-receiving region 61 includes two gates and electric charge accumulating units corresponding to the gates. The 3D sensor 6 is configured to transfer photoelectrons generated by alternately applying pulses to the two gates to one of the two electric charge accumulating units at a high speed and accumulate electric charges corresponding to a phase difference between an emitted light pulse and a received light pulse. Then, a digital value corresponding to electric charges corresponding to the phase difference between the emitted light pulse and the received light pulse for each light-receiving region 61 is output as a signal via an AD converter. That is, the 3D sensor 6 outputs a signal corresponding to a time from when light is emitted from the proximity detection light-emitting element array 10 to when the light is received by the 3D sensor 6, and a signal corresponding to a time from when light is emitted from the 3D shape measurement light-emitting element array 20 to when the light is received by the 3D sensor 6.

(Flowchart of Authentication Processing in Information Processing Device 1)

Figure 11:
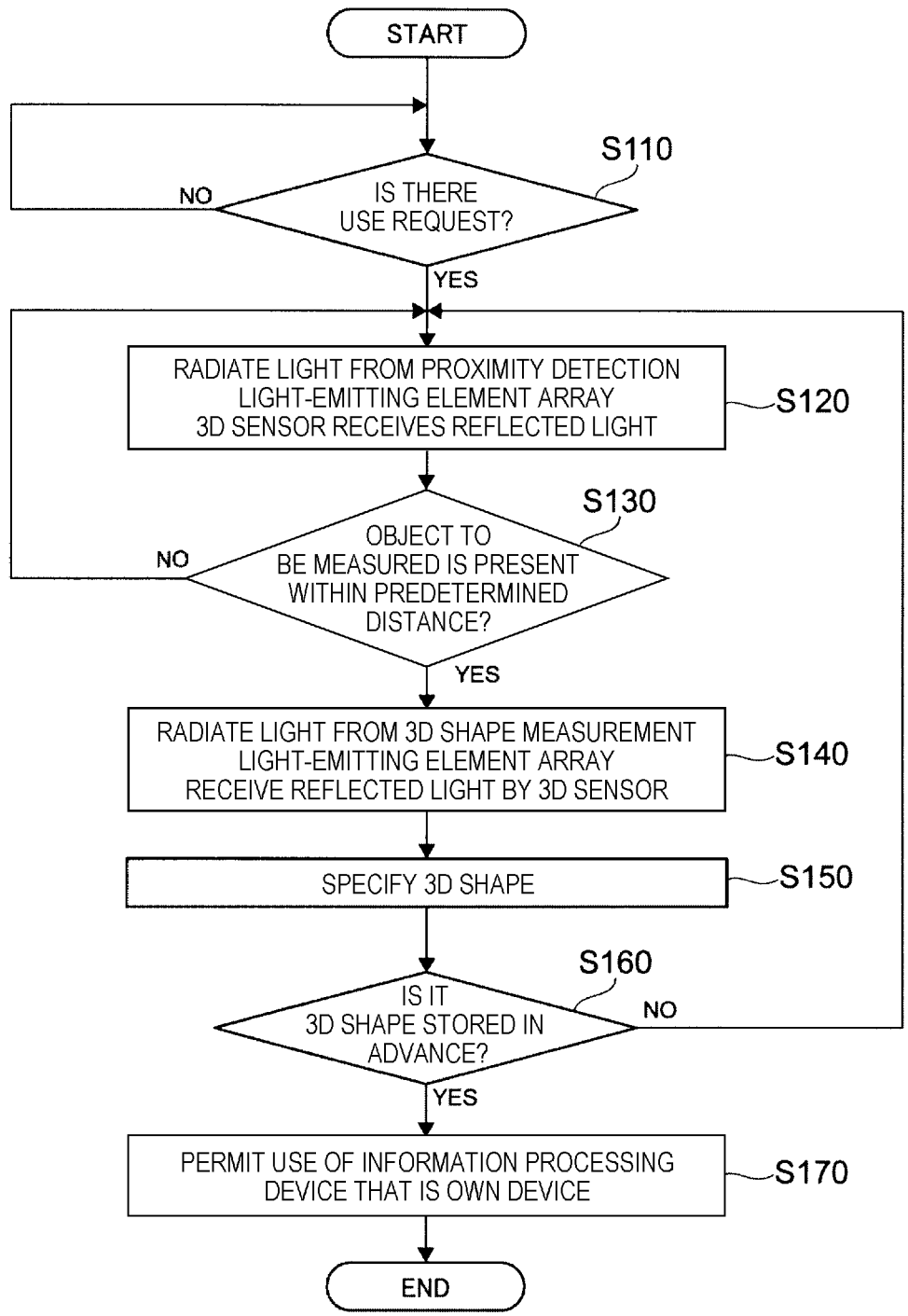
FIG. 11 is a flowchart showing an authentication processing related to the use of the information processing device.

FIG. 11 is a flowchart showing an authentication processing related to the use of the information processing device 1.

Here, the information processing device 1 has at least an off state in which a power source is turned off, a standby state in which the power source is supplied to only a part of the information processing device 1, and an operation state in which the power source is supplied to more parts than in the standby state, for example, the power source is supplied to the entire information processing device 1.

First, it is determined whether there is a use request for the information processing device 1 (step S110. It is denoted as step S110 in FIG. 11. The same applies hereinafter). A case where there is a use request refers to a case where the power source is turned on in the off state, a case where an operation for using the information processing device 1 is performed by a user in the standby state, or the like. A case where a telephone call, a mail, or the like is received in the standby state is also referred to as a case where there is a use request. That is, a case where the system control unit 9 receives a signal for transitioning to an operation state corresponds to a case where there is a use request.

When it is determined that there is no use request (NO) in step 110, that is, when the off state or the standby state continues, step 110 is repeated.

On the other hand, when it is determined that there is a use request (YES) in step 110, the information processing device 1 transitions to an operation state, light is radiated from the proximity detection light-emitting element array 10 to the object to be measured, and reflected light from the object to be measured is received by the 3D sensor 6 (step 120). Regardless of the presence or absence of the use request in step 110, light may be continuously radiated from the proximity detection light-emitting element array 10 in the standby state.

Next, it is determined whether the object to be measured comes close or not (step 130). The matter that the object to be measured comes close refers to that the object to be measured is within a predetermined distance. When it is determined that the object to be measured does not come close (NO) in step 130, that is, when the object to be measured does not come close, the processing returns to step 120.

On the other hand, when it is determined that the object to be measured comes close (YES) in step 130, that is, when the object to be measured comes close, light is radiated from the 3D shape measurement light-emitting element array 20, and reflected light from the object to be measured is received by the 3D sensor 6 (step 140). At this time, the radiation of the light from the proximity detection light-emitting element array 10 may be stopped or may be continued. When the radiation of light from the proximity detection light-emitting element array 10 is continued, the irradiation pattern on the irradiation surface is more likely to be uniform as compared with a case where the radiation of the light is not continued.

Then, based on an amount of light received by the 3D sensor 6, a 3D shape of the object to be measured is specified by the shape specifying unit 81 of the optical device control unit 8 (step 150).

Next, it is determined whether the 3D shape that is a specification result specified by the authentication processing unit 91 is a predetermined shape (step 160). When it is determined that the specified shape is the predetermined shape (YES) in step 160, that is, when the specified 3D shape is the predetermined shape, the use of the own device (the information processing device 1) is permitted (step 170). On the other hand, when it is determined that the specified shape is not the predetermined shape (NO) in step 160, that is, when the specified 3D shape is not a shape stored in advance in the ROM or the like, the use of the information processing device 1 that is the own device is not permitted, and the processing returns to step 120. In addition to a 3D shape, other information such as a two-dimensional image acquired by the 2D camera 93 may be taken into consideration to determine whether to permit the use of the information processing device 1 that is the own device.

As described above, the information processing device 1 according to the present exemplary embodiment includes the proximity detection light-emitting element array 10 and the 3D shape measurement light-emitting element array 20. The information processing device 1 determines whether the object to be measured comes close to the information processing device 1 by radiating light from the proximity detection light-emitting element array 10, and when the object to be measured comes close to the information processing device 1, the information processing device 1 radiates light for a 3D measurement from the 3D shape measurement light-emitting element array 20. That is, when the object to be measured does not come close, the 3D shape measurement light-emitting element array 20 is prevented from emitting light. At this time, a light output of the proximity detection light-emitting element array 10 is smaller than a light output of the 3D shape measurement light-emitting element array 20, and thus power consumption is reduced. When the information processing device 1 is a portable information processing terminal, a decrease in a charge amount of a battery is prevented.

(Connection Relationship Among Proximity Detection Light-Emitting Element Array 10, 3D Shape Measurement Light-Emitting Element Array 20, and Circuit Board 7)

Next, a connection relationship among the proximity detection light-emitting element array 10, the 3D shape measurement light-emitting element array 20, and conductor patterns provided on the circuit board 7 will be described with reference to FIG. 4.

A cathode pattern 71 for the proximity detection light-emitting element array 10, an anode pattern 72, a cathode pattern 73 for the 3D shape measurement light-emitting element array 20, and anode patterns 74A and 74B are provided as conductor patterns on the circuit board 7.

As described above, the cathode electrode 114 is provided on the back surface, and the anode electrode 118 is provided on the front surface of the proximity detection light-emitting element array 10 (see FIG. 5). The anode electrode 118 connects the p-side electrodes 112 of four VCSELs A, and includes a pad portion 118A to which a bonding wire 76 to be described later is connected.

Similarly, the cathode electrode 214 is provided on the back surface, and the anode electrode 218 is provided on the front surface of the 3D shape measurement light-emitting element array 20 (see FIG. 6). The anode electrode 218 is formed in a manner in which the anode electrodes 218 of the VCSELs-B arranged in a matrix are connected, and the anode electrode 218 includes pad portions 218A and 218B that extend in the ±y direction and to which bonding wires 75A and 75B to be described later are connected.

The cathode pattern 71 for the proximity detection light-emitting element array 10 is formed to have a larger area than the proximity detection light-emitting element array 10, so that the cathode electrode 114 provided on the back surface of the proximity detection light-emitting element array 10 is connected to the cathode pattern 71. The cathode electrode 114 provided on the back surface of the proximity detection light-emitting element array 10 and the cathode pattern 71 for the proximity detection light-emitting element array 10 on the circuit board 7 are bonded to each other using a conductive adhesive. The pad portion 118A of the anode electrode 118 of the proximity detection light-emitting element array 10 is connected to the anode pattern 72 on the circuit board 7 by the bonding wire 76.

Similarly, the cathode pattern 73 for the 3D shape measurement light-emitting element array 20 is formed to have a larger area than the 3D shape measurement light-emitting element array 20, so that the cathode electrode 214 provided on the back surface of the 3D shape measurement light-emitting element array 20 is connected to the cathode pattern 73. The 3D shape measurement light-emitting element array 20 is bonded onto the cathode pattern 73 for the 3D shape measurement light-emitting element array 20 using a conductive adhesive or the like.

The anode patterns 74A and 74B for the 3D shape measurement light-emitting element array 20 are provided in a manner of facing two opposite sides (±y direction sides) of the anode electrode 218 (see FIG. 6) provided on the front surface of the 3D shape measurement light-emitting element array 20. The anode patterns 74A and 74B and the pad portions 218A and 218B of the anode electrode 218 of the 3D shape measurement light-emitting element array 20 are connected to each other by bonding wires 75A and 75B, respectively. Although plural bonding wires 75A and 75B are provided, one of the bonding wires 75A and one of the bonding wires 75B are denoted by a reference numeral.
(Drive Method)

When it is desired to drive the proximity detection light-emitting element array 10 and the 3D shape measurement light-emitting element array 20 at a higher speed, both the proximity detection light-emitting element array 10 and the 3D shape measurement light-emitting element array 20 may be driven on a low side. Low side driving refers to a configuration in which a drive unit such as a MOS transistor is located downstream of a current path relative to a drive target such as a VCSEL. Conversely, a configuration in which a drive unit is located upstream is referred to as high side driving. In the present exemplary embodiment, in order to drive both of the proximity detection light-emitting element array 10 and the 3D shape measurement light-emitting element array 20 on a low side, cathodes of both the proximity detection light-emitting element array 10 and the 3D shape measurement light-emitting element array 20 are driven independently.

Figure 12:
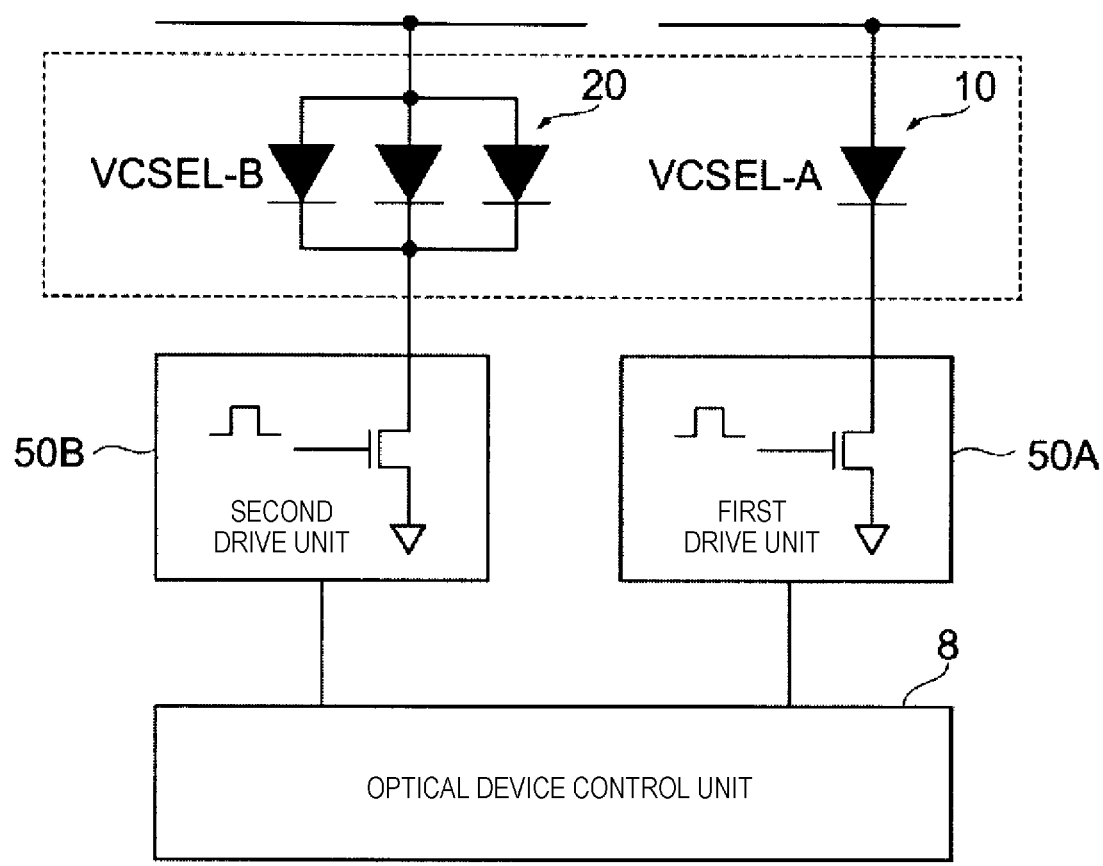
FIG. 12 is a diagram showing low side driving.

FIG. 12 is a diagram showing the low side driving. FIG. 12 shows a relationship among the VCSEL-A of the proximity detection light-emitting element array 10, the VCSEL-B of the 3D shape measurement light-emitting element array 20, the first drive unit 50A, the second drive unit 50B, and the optical device control unit 8. The first drive unit 50A and the second drive unit 50B are grounded via MOS transistors. That is, by turning on or off the MOS transistor, the low side driving of the VCSEL is performed.

In FIG. 12, an anode side of the VCSEL-A of the proximity detection light-emitting element array 10 and an anode side of the VCSEL-B of the 3D shape measurement light-emitting element array 20 are also separated from each other.
(Arrangement of Proximity Detection Light Emitting Element Array 10, 3D Shape Measurement Light Emitting Element Array 20, and Light Amount Monitoring Light Receiving Element 40 in Light Emitting Device 4)

Figure 13A:
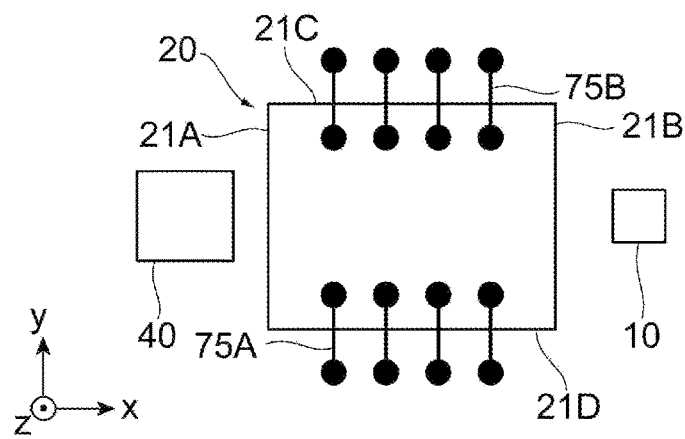
FIG. 13A is a diagram showing an arrangement of the proximity detection light-emitting element array, the 3D shape measurement light-emitting element array, and a light amount monitoring light-receiving element in a light-emitting device according to the present exemplary embodiment.
Figure 13B:
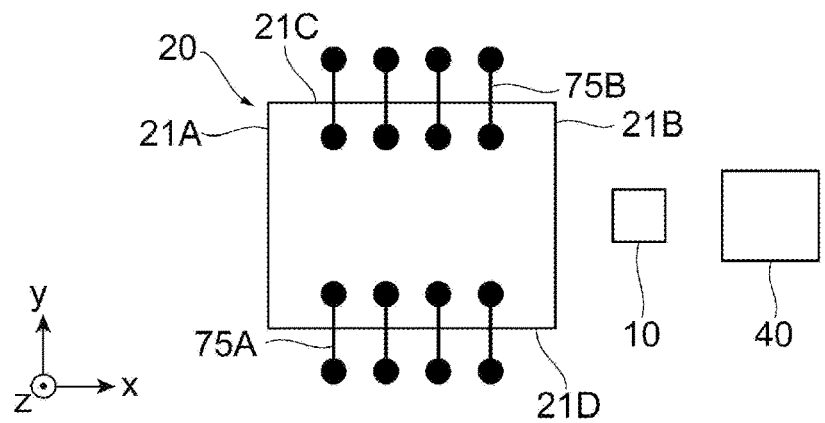
FIG. 13B is a diagram showing a first modification of the arrangement of the proximity detection light-emitting element array, the 3D shape measurement light-emitting element array, and a light amount monitoring light-receiving element in the light-emitting device.
Figure 13C:
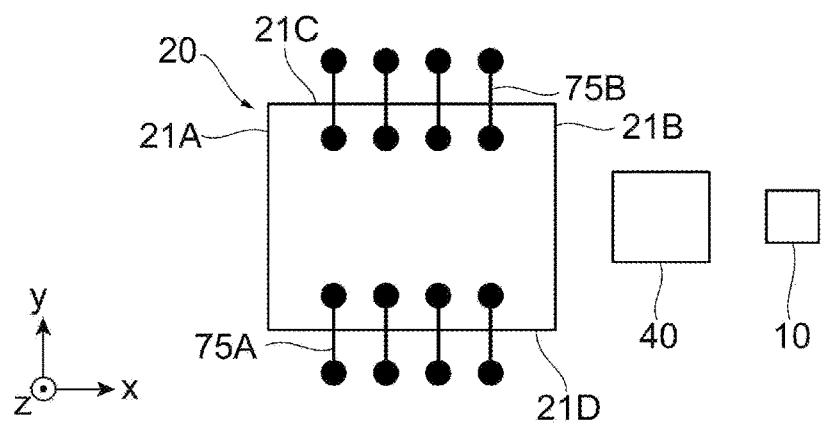
FIG. 13C is a diagram showing a second modification of the arrangement of the proximity detection light-emitting element array, the 3D shape measurement light-emitting element array, and a light amount monitoring light-receiving element in the light-emitting device.
Figure 13D:
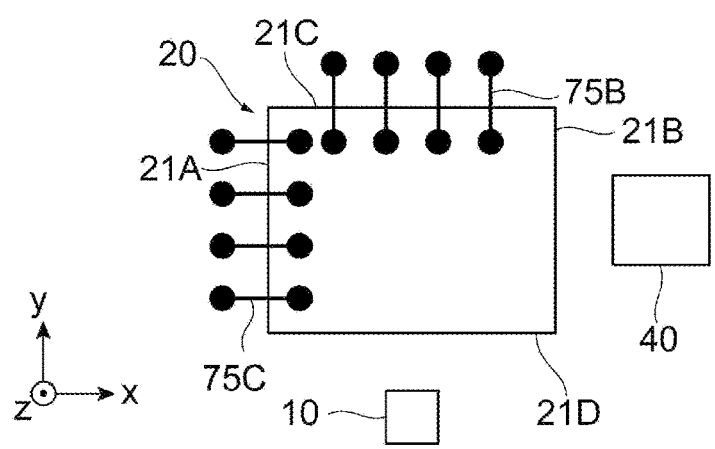
FIG. 13D is a diagram showing a third modification of the arrangement of the proximity detection light-emitting element array, the 3D shape measurement light-emitting element array, and a light amount monitoring light-receiving element in the light-emitting device.

FIGS. 13A, 13B, 13C, and 13D are diagrams showing an arrangement of the proximity detection light-emitting element array 10, the 3D shape measurement light-emitting element array 20, and the light amount monitoring light-receiving element 40 in the light-emitting device 4. FIG. 13A shows an arrangement described as the present exemplary embodiment, FIG. 13B shows a first modification of the arrangement, FIG. 13C shows a second modification of the arrangement, and FIG. 13D shows a third modification of the arrangement. Here, the proximity detection light-emitting element array 10, the 3D shape measurement light-emitting element array 20, the light amount monitoring light-receiving element 40, and the bonding wire are shown, and other components are omitted. A side surface in the −x direction of the 3D shape measurement light-emitting element array 20 having a quadrangular planar shape is defined as a side surface 21A, a side surface in the +x direction is defined as a side surface 21B, a side surface in the +y direction is defined as a side surface 21C, and a side surface in the −y direction is defined as a side surface 21D. Here, the side surface 21A and the side surface 21B face each other, and the side surface 21C and the side surface 21D face each other and connect the side surface 21A and the side surface 21B.

In the arrangement described as the present exemplary embodiment (see FIG. 3A), the light amount monitoring light-receiving element 40 is provided at the side surface 21A side in the −x direction of the 3D shape measurement light-emitting element array 20 as shown in FIG. 13A. The proximity detection light-emitting element array 10 is provided at the side surface 21B side in the +x direction of the 3D shape measurement light-emitting element array 20. The bonding wires 75A and 75B that connect the anode electrode 218 (see FIG. 6) of the 3D shape measurement light-emitting element array 20 and the anode patterns 74A and 74B (see FIG. 4) provided on the circuit board 7 are provided in a manner of facing the side surfaces 21C and 21D in the ±y direction of the 3D shape measurement light-emitting element array 20.

In this manner, a current is supplied to each of the VCSELs-B of the 3D shape measurement light-emitting element array 20 that are symmetrically in the ±y direction of the 3D shape measurement light-emitting element array 20. Therefore, as compared with a third comparative example shown in FIG. 13D which will be described later, a current is more likely to be uniformly supplied to each of the VCSELs-B of the 3D shape measurement light-emitting element array 20.

No bonding wire is provided at the side surface 21A side in the −x direction of the 3D shape measurement light-emitting element array 20 where the light amount monitoring light-receiving element 40 is disposed. Therefore, it is easy to dispose the light amount monitoring light-receiving element 40 close to the 3D shape measurement light-emitting element array 20. Therefore, the light amount monitoring light-receiving element 40 is likely to receive light reflected by the diffusion plate 30 among the light emitted from the 3D shape measurement light-emitting element array 20, as compared with a second comparative example shown in FIG. 13C which will be described later.

In the first modification of the arrangement shown in FIG. 13B, the light amount monitoring light-receiving element 40 is disposed at the side surface 21B side in the +x direction of the 3D shape measurement light-emitting element array 20 and is disposed outward of the proximity detection light-emitting element array 10. That is, a distance between the 3D shape measurement light-emitting element array 20 and the light amount monitoring light-receiving element 40 is longer than that in the arrangement in the present exemplary embodiment shown in FIG. 13A. Therefore, a received amount of light reflected by the diffusion plate 30 among the light emitted from the 3D shape measurement light-emitting element array 20 is reduced. That is, it is difficult to receive the light reflected by the diffusion plate 30, and detection accuracy may be lowered.

In the second modification of the arrangement shown in FIG. 13C, the light amount monitoring light-receiving element 40 is disposed at the side surface 21B in the +x direction of the 3D shape measurement light-emitting element array 20 and is disposed between the 3D shape measurement light-emitting element array 20 and the proximity detection light-emitting element array 10. Therefore, it is easy to dispose the light amount monitoring light-receiving element 40 close to the 3D shape measurement light-emitting element array 20. Therefore, similar to the arrangement shown in FIG. 13A described above, a current is more likely to be uniformly supplied to each of the VCSELs-B of the 3D shape measurement light-emitting element array 20, and the light amount monitoring light-receiving element 40 is likely to receive the light reflected by the diffusion plate 30 among the light emitted from the 3D shape measurement light-emitting element array 20.

In the third modification of the arrangement shown in FIG. 13D, the bonding wire 75A shown in FIG. 13A is not provided. Instead, an anode pattern is separately provided on the circuit board 7 at the side surface 21A side in the −x direction of the 3D shape measurement light-emitting element array 20, and a bonding wire 75C for connecting the anode electrode 218 of the 3D shape measurement light-emitting element array 20 and an anode pattern separately provided on the circuit board 7 is provided. Although plural bonding wires 75C are provided, only one of the bonding wires 75C is denoted by a reference numeral.

The proximity detection light-emitting element array 10 is provided at the side surface 21D side in the −y direction of the 3D shape measurement light-emitting element array 20, and the light amount monitoring light-receiving element 40 is provided at the side surface 21B side in the +x direction of the 3D shape measurement light-emitting element array 20. In this manner, the 3D shape measurement light-emitting element array 20 and the light amount monitoring light-receiving element 40 are arranged close to each other. However, since a current is supplied to the VCSEL-B of the 3D shape measurement light-emitting element array 20 from two sides of the side surface 21C side in the +y direction and the side surface 21A side in the −x direction, it is difficult to uniformly supply the current to each of the VCSELs-B of the 3D shape measurement light-emitting element array 20. Therefore, the third modification may be used in a specification in which there is little influence even when a current is not uniformly supplied.

Although the light-emitting device 4 and the 3D sensor 6 are disposed on the common circuit board 7 in the configuration described above, the light-emitting device 4 and the 3D sensor 6 may be disposed on different circuit boards. In the light-emitting device 4, at least the proximity detection light-emitting element array 10, the 3D shape measurement light-emitting element array 20, the diffusion plate 30, and the spacer 33 may be provided on a substrate different from the circuit board 7, and may be configured as one light-emitting component (module) that may be connected to the circuit board 7 on which the first drive unit 50A, the second drive unit 50B, the 3D sensor 6, and the like are mounted. For example, a maximum outer shape of the light emitting component may be defined by the diffusion plate 30 that covers the proximity detection light-emitting element array 10 and the 3D shape measurement light-emitting element array 20, the spacer 33, and the substrate. According to such a configuration, since the first drive unit 50A, the second drive unit 50B, the 3D sensor 6, and the like are not mounted on the light-emitting component, the light-emitting component is provided and distributed as a small component. Since the proximity detection light-emitting element array 10 and the 3D shape measurement light-emitting element array 20 are sealed by being surrounded by the diffusion plate 30, the spacer 33, and the substrate, dust-proof, moisture-proof, and the like are obtained as compared with a case where the proximity detection light-emitting element array 10 and the 3D shape measurement light-emitting element array 20 are not sealed. The light-emitting component may or may not include the light amount monitoring light-receiving element 40.

In the configuration described above, the proximity detection light-emitting element array 10 does not necessarily need to be used in combination with the 3D shape measurement light-emitting element array 20. For example, the proximity detection light-emitting element array 10 may be provided as a single proximity detection light-emitting element array for a distance measurement regardless of whether to measure a 3D shape. That is, the proximity detection light-emitting element array 10 may be provided as a single vertical cavity surface emitting laser element array having plural long cavity structures that are connected in parallel to one another. In such a configuration, when the proximity detection light-emitting element array 10 is driven in a range lower than a range in which the power conversion efficiency is maximized (for example, 4 mW or more and 8 mW or less), a light density is increased while an increase in a spread angle is prevented, as compared with a case where the proximity detection light-emitting element array 10 is driven in a range in which the power conversion efficiency of only one surface emitting laser element is maximized. Therefore, particularly in a configuration in which a visual field range of a light-receiving unit is narrow and light is radiated onto an irradiation surface in a range wider than the visual field range of the light-receiving unit, light is received with a higher SN ratio.

In the configuration described above, the proximity detection light-emitting element array 10 may be applied not only to a proximity detection light-emitting element array for a distance measurement, but also applied to a proximity detection light-emitting element array for other applications in which it is desired to increase a light density while preventing an increase in a spread angle.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting device comprising:
 a first light-emitting element array that includes a plurality of first light-emitting elements arranged at a first interval;
 a second light-emitting element array that includes a plurality of second light-emitting elements arranged at a second interval wider than the first interval, the second light-emitting element array being configured to output a light output larger than a light output of the first light-emitting element array, and being configured to be driven independently from the first light-emitting element array; and
 a light diffusion member including a first region and a second region, wherein
 the first region is provided on an emission path of the first light-emitting element array,
 the second region is provided on an emission path of the second light-emitting element array, and
 a diffusion angle of the first region is smaller than a diffusion angle of the second region.

2. The light-emitting device according to claim 1, wherein
 a spread angle of light emitted from the first light-emitting elements is smaller than a spread angle of light emitted from the second light-emitting elements toward the light diffusion member.

3. The light-emitting device according to claim 1, wherein the first light-emitting elements include a laser element that emits single mode light.

4. The light-emitting device according to claim 2, wherein the first light-emitting elements include a laser element that emits single mode light.

5. The light-emitting device according to claim 3, wherein the first light-emitting elements include a vertical cavity surface emitting laser element that has a long cavity structure having a cavity length of 5λ or more and 20λ or less when an oscillation wavelength is λ.

6. The light-emitting device according to claim 4, wherein the first light-emitting elements include a vertical cavity surface emitting laser element that has a long cavity structure having a cavity length of 5λ or more and 20λ or less when an oscillation wavelength is λ.

7. The light-emitting device according to claim 1, wherein the second light-emitting elements include a laser element that emits multi-mode light.

8. The light-emitting device according to claim 2, wherein the second light-emitting elements include a laser element that emits multi-mode light.

9. The light-emitting device according to claim 3, wherein the second light-emitting elements include a laser element that emits multi-mode light.

10. The light-emitting device according to claim 4, wherein the second light-emitting elements include a laser element that emits multi-mode light.

11. The light-emitting device according to claim 1, wherein
each of the first light-emitting elements and the second light-emitting elements is a vertical cavity surface emitting laser element, and
the first light-emitting element array and the second light-emitting element array are driven such that a light output emitted from one of the vertical cavity surface emitting laser elements as a first light-emitting element is smaller than a light output emitted from one of the vertical cavity surface emitting laser elements as a second light-emitting element.

12. The light-emitting device according to claim 1, wherein
each of the first light-emitting elements and the second light-emitting elements is a vertical cavity surface emitting laser element, and
the first light-emitting element array and the second light-emitting element array are driven to have light outputs such that a power conversion efficiency of the vertical cavity surface emitting laser element as a first light-emitting element is lower than a power conversion efficiency of the vertical cavity surface emitting laser element as a second light-emitting element.

13. The light-emitting device according to claim 11, wherein
the first light-emitting element array is driven such that a light output of one of the vertical cavity surface emitting laser element as the first light-emitting element is in a range of 1 mW or more and 4 mW or less.

14. The light-emitting device according to claim 12, wherein
the first light-emitting element array is driven such that a light output of one of the vertical cavity surface emitting laser element as the first light-emitting element is in a range of 1 mW or more and 4 mW or less.

15. The light-emitting device according to claim 11, wherein
the second light-emitting element array is driven such that a light output of one of the vertical cavity surface emitting laser element as the second light-emitting element is in a range of 4 mW or more and 8 mW or less.

16. An optical device comprising:
the light-emitting device according to claim 1; and
a light-receiving unit that receives first reflected light that is emitted from the first light-emitting elements included in the first light-emitting element array provided in the light-emitting device and reflected by an object to be measured, and second reflected light that is emitted from the second light-emitting elements included in the second light-emitting element array provided in the light-emitting device and reflected by the object to be measured, wherein
the light-receiving unit outputs a signal corresponding to a time from when light is emitted from the first light-emitting elements to when the light is received by the light-receiving unit, and a signal corresponding to a time from when light is emitted from the second light-emitting elements to when the light is received by the light-receiving unit.

17. An optical device comprising:
the light-emitting device according to claim 1; and
a light-receiving unit that receives first reflected light that is emitted from the first light-emitting elements included in the first light-emitting element array provided in the light-emitting device and reflected by an object to be measured, and second reflected light that is emitted from the plurality of second light-emitting elements included in the second light-emitting element array provided in the light-emitting device and reflected by the object to be measured, and
light is emitted from the plurality of second light-emitting elements in a case where the first reflected light is light indicating that the object to be measured is present within a predetermined distance.

18. An information processing device comprising:
the optical device according to claim 16; and
processing circuitry configured to perform specification processing to specify a three-dimensional shape of the object to be measured based on the second reflected light that is emitted from the second light-emitting elements included in the second light-emitting element array provided in the optical device, reflected by the object to be measured, and is received by the light-receiving unit provided in the optical device.

19. The information processing device according to claim 18, wherein
the processing circuitry is configured to perform an authentication processing related to use of the information processing device based on a result of the specification processing.

* * * * *